United States Patent [19]

Kim

[11] Patent Number: 5,519,361

[45] Date of Patent: May 21, 1996

[54] PULSE WIDTH CONTROLLER ADOPTING FEEDBACK PWM INTEGRATION SYSTEM EMPLOYING CARRIER-SYNCHRONOUS SIGNAL

[75] Inventor: Jin-bok Kim, Changwon, Rep. of Korea

[73] Assignee: Samsung Aerospace Industries, Ltd., Kyongsangnam-do, Rep. of Korea

[21] Appl. No.: 451,724

[22] Filed: May 26, 1995

[30] Foreign Application Priority Data

Apr. 12, 1995 [KR] Rep. of Korea .................. 95-8513

[51] Int. Cl.$^6$ ............................................ H03K 7/08
[52] U.S. Cl. ........................................ 332/109; 375/238
[58] Field of Search .................................. 332/109, 110, 332/111; 375/238

[56] References Cited

U.S. PATENT DOCUMENTS 4,145,652  3/1979  Hayashi .................................. 324/142
5,457,435  10/1995  Hoffman ................................ 332/109

Primary Examiner—Siegfried H. Grimm
Attorney, Agent, or Firm—Finnegan, Henderson, Farabow, Garrett & Dunner

[57] ABSTRACT

A pulse width controller comprising a circuit for generating a carrier signal; a carrier synchronization circuit for generating a carrier synchronous variable pulse signal that varies in accordance with the voltage level of the carrier signal; an integrator for integrating a reference signal, the carrier signal and the carrier synchronous variable pulse signal to generate an integrated input signal; a comparator for comparing the integrated input signal with a comparison signal to generate a compared input signal; and a circuit for synchronizing the compared input signal with one or more of the carrier signal and carrier synchronous variable pulse signal to generate a synchronous input signal and providing the synchronous input signal to the input of the integrator to be integrated with other signals.

14 Claims, 27 Drawing Sheets

INPUT VOLTAGE 0V

INPUT VOLTAGE 2V

PULSE WIDTH CONTROLLER ADOPTING FEEDBACK PWM INTEGRATION SYSTEM EMPLOYING CARRIER-SYNCHRONOUS SIGNAL

BACKGROUND OF THE INVENTION

The present invention relates to a pulse width controller adopting a feedback pulse width modulation (PWM) integration system employing a carrier-synchronous signal. The pulse width controller employs a pulse signal synchronized with the rising and falling edges of a carrier and, in converting an analog signal into a digital signal, precisely changes the width of an output pulse signal according to the amplitude of an externally applied analog signal.

At present, pulse width modulation is used in various types of equipment. In such equipment, when analog information is to be transmitted, an original analog signal is loaded onto a high frequency carrier and transmitted using a modulation system. The modulation system can be divided into a frequency division modulation subsystem for modulating the amplitude, frequency, and phase of a carrier with respect to an original signal, and a time division modulation subsystem for modulating a carrier by employing a pulse signal.

The modulation techniques used in these subsystems are largely used in communication systems that transmit voice information and images, such as consumer appliances, and are applied to instrumentation control systems such as digital power meters, voltmeters, various recorders, and other industrial instruments. In particular, techniques adopted to analog instrumentation can be extended to analog-to-digital (A/D) conversion. These techniques involve methods for converting analog signals into digital pulse signals and transmitting the results. A pulse amplitude modulation technique and a pulse width modulation technique therefore form the mainstream of precise modulation methods.

Among the precise modulation methods, the PWM integration technique to be applied to an A/D converter can be divided into a voltage-time (V-T) converting system and a voltage-frequency (V-F) converting system, according to the principles of its particular operation.

The V-T converting system generally employs a dual slope integration method and has a relatively simple circuit constitution. However, resolution is limited in this system due to an offset voltage of an integrator, variations in the dielectric characteristics of a capacitor, and the poor resolution and slow response time of a comparator.

To solve these problems, a charge balancing system, i.e., a V-F converting system, has been developed. However, errors still exist in this system due to the high speed of the changes to the input waveform of the comparator, and since the signal applied to the integrator includes a high frequency component.

To reduce these errors, a feedback PWM integration system, i.e., a V-T converting system, that sets a signal converting rate of the comparator to a suitable scope for circuit design and restricts the response of the integrator to a frequency which is somewhat low, has been developed. In this system, however, time is required to integrate the input signal into a correct conversion valued, creating a delay which necessitates a synchronization method in order to improve the response characteristics.

The above discussion primarily deals with methods or means for speeding up the conversion of an integration-type A/D converter, increasing resolution or reducing errors. These methods, however, cannot in themselves offer optimum enhancement for pulse width modulation.

SUMMARY OF THE INVENTION

Accordingly, it is an object of the present invention to provide a pulse width controller adopting a feedback PWM integration system employing a carrier-synchronous signal. Here, the controller allows the voltage of an input analog signal to be integrated more accurately into a digital conversion value.

To accomplish the above object, a pulse width controller, as embodied and broadly defined herein, comprises means for generating a carrier signal; carrier synchronization means for generating a carrier synchronous variable pulse signal that varies in accordance with the voltage level of the carrier signal; an integrator for integrating a reference signal, the carrier signal and the carrier synchronous variable pulse signal to generate an integrated input signal; a comparator for comparing the integrated input signal with a comparison signal to generate a compared input signal; and means for synchronizing the compared input signal with one or more of the carrier signal and carrier synchronous variable signal to generate a synchronous input signal and providing the synchronous input signal to the input of the integrator to be integrated with other signals.

BRIEF DESCRIPTION OF THE DRAWINGS

The above objects and other advantages of the present invention will become more apparent by describing in detail a preferred embodiment thereof with reference to the attached drawings in which:

FIGS. 8D to 8O illustrate the waveform of a PWM signal output from an actual circuit according to pulse width $T_i$ of the negative carrier-synchronous variable pulse signal;

DETAILED DESCRIPTION OF A PREFERRED EMBODIMENT OF THE INVENTION

Figure 1:
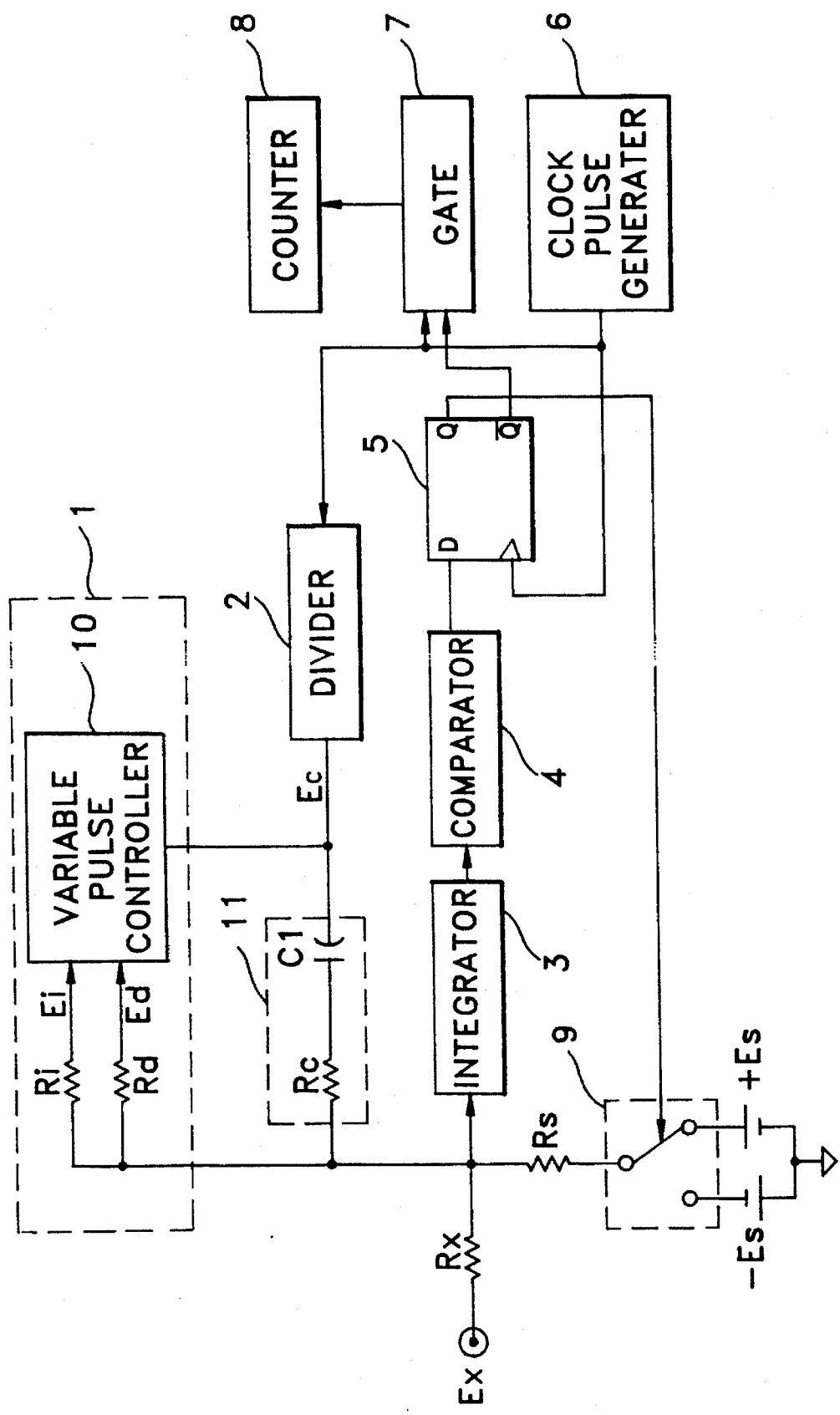
FIG. 1 is a block diagram of a pulse width controller adopting a feedback PWM integration system employing a carrier-synchronous signal according to a preferred embodiment of the present invention.
Figure 2:
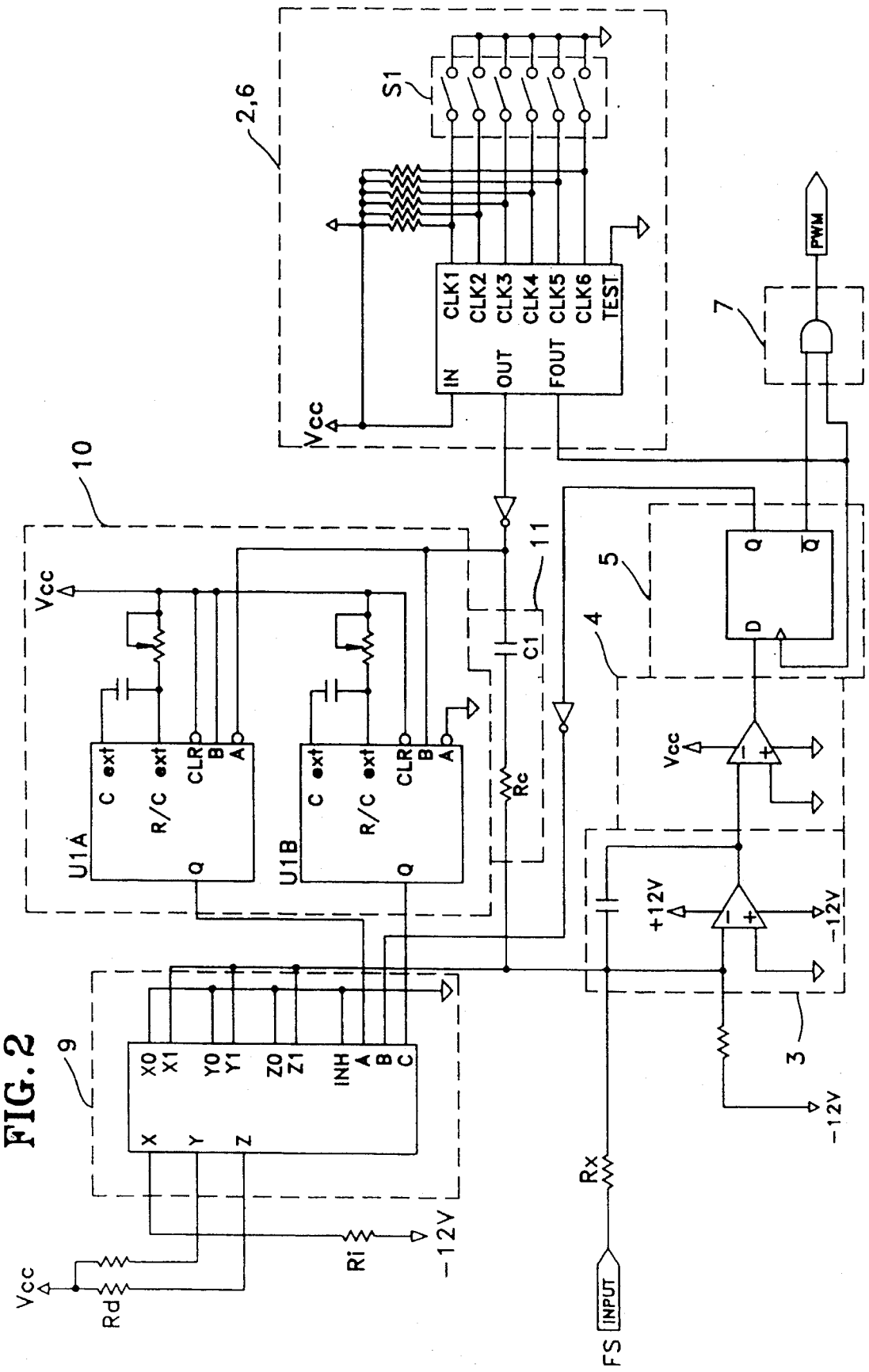
FIG. 2 is a circuit diagram of the pulse width controller adopting a feedback PWM integration system employing a carrier-synchronous signal according to a preferred embodiment of the present invention.

FIG. 1 is a block diagram of a pulse width controller of a preferred embodiment of the present invention adopting a feedback PWM integration system employing a carrier-synchronous signal. FIG. 2 is a detailed circuit diagram of the pulse width controller of FIG. 1.

As shown in FIGS. 1 and 2, the pulse width controller adopts a feedback PWM integration system using a carrier-synchronous signal and largely comprises a carrier synchronization circuit 1, an integrator 3 (e.g., 1 a TL082 chip), a comparator 4 (e.g., an LM339 chip), a D flip-flop 5 (e.g., a 74LS74 chip), a clock pulse generator 6, a divider 2, an AND gate 7 (e.g., a 74LS08 chip), a counter 8, an analog switch 9 (e.g., a 4053 chip), and a high-pass filter 11. As shown in FIG. 2, the clock pulse generator 6 and the divider 2 may be in the form of a single chip, e.g., a 8650A chip.

Figure 3A:
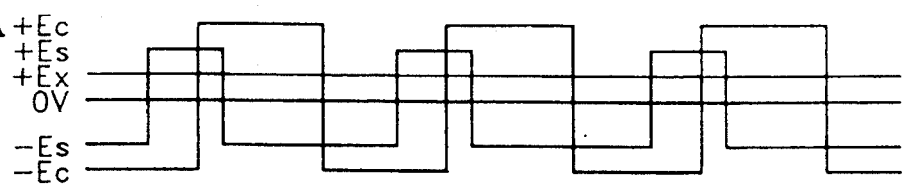
FIGS. 3A to 3H illustrate voltage signal waveforms of the circuit diagram of FIG. 2 according to a preferred embodiment of the present invention.
Figure 3B:
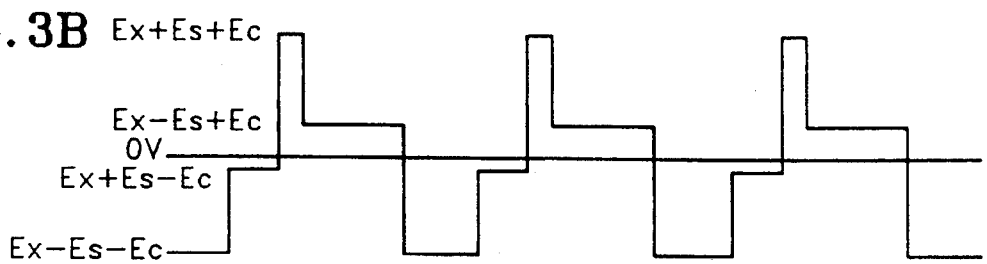
Figure 3C:
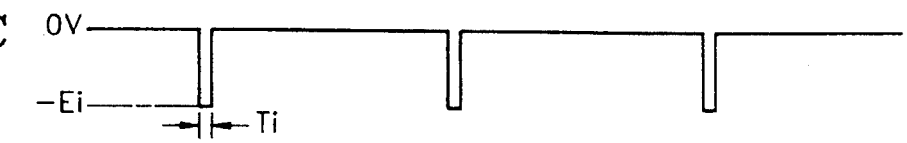
Figure 3D:

Integrator 3 receives and integrates the carrier-synchronous variable pulse signals $E_i$ and $E_d$ (as shown in FIGS. 3C and 3D), and the composite of the externally provided analog signal $E_x$, carrier signal $E_c$, and standard (reference) signal $E_s$ (as shown in FIG. 3A). At this time, the carrier-synchronous variable pulse signals $E_i$ and $E_d$ are synchronized with carrier signal $E_c$ and vary depending on the pulse width thereof.

Figure 3E:
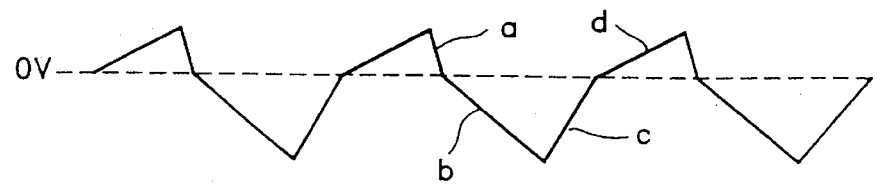
Figure 3F:
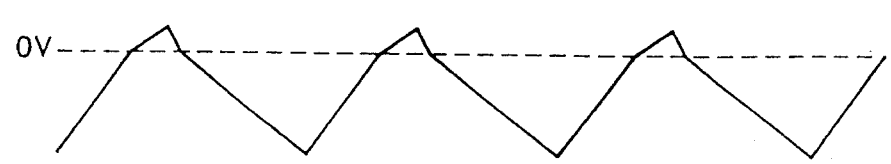
Figure 3G:
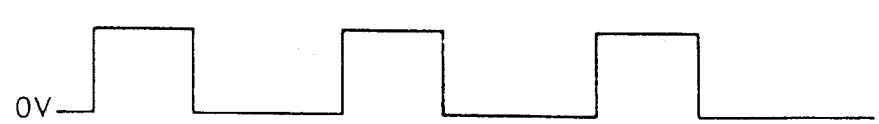
Figure 3H:
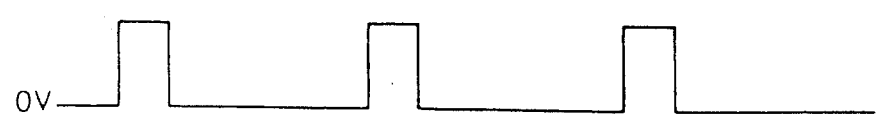

Comparator 4 compares the integrated output voltage from integrator 3 and a reference voltage (preferably 0 V) as shown in FIG. 3E and FIG. 3F, and outputs a comparison value as shown in FIG. 3G and FIG. 3H.

D flip-flop 5 synchronizes the output of comparator 4 with the carrier signal $E_c$ which is generated by divider 2 and feeds the result back to the input of integrator 3. Here, by supplying the fundamental clock frequency generated from clock generator 6 to the clock port of the D flip-flop 5, the output signal of comparator 4 is synchronized with carrier signal $E_c$.

Clock pulse generator 6 generates a fundamental clock pulse having a fundamental clock frequency and provides it to the D flip-flop 5 and the divider 2.

Divider 2 divides the fundamental clock pulse generated by clock pulse generator 6 at a predetermined rate to produce carrier signal $E_c$ and provides the carrier signal to the input of integrator 3. In the present preferred embodiment, the dividing rate is set by a DIP switch S1.

AND gate 7 logically multiplies an output of the D flip-flop 5 with the fundamental clock pulse, and serves as a buffer for current-amplifying the output signal of the D flip-flop 5 where the pulse width of the output of the comparator appears as the fundamental clock pulse. The counter 8 counts the number of clock pulses of the output PWM signal and uses the number as digital information corresponding to an analog input signal.

Analog switch 9 connects a positive or negative reference signal to the input of integrator 3 by employing the output signal of comparator 4 which is fed back via the D flip-flop 5.

Carrier synchronization circuit 1 is a characteristic part of the present invention and is made up of a variable pulse controller 10 comprising two monostable multivibrators U1A and U1B, e.g., 74LS123 chips and connected to two resistors $R_i$ and $R_d$. In the preferred embodiment, resistor $R_i$ is connected to the first monostable multivibrator U1A via analog switch 9 and thus corresponds to the negative reference voltage $-E_s$. Similarly, resistor $R_d$ is connected to the second monostable multivibrator U1B via analog switch 9 and thus corresponds to the positive reference voltage $+E_s$. In other words, if the output value of comparator 4 is "high," negative reference voltage $-E_s$ is connected to resistor $R_i$, and if the output vale of comparator 4 is "low," positive reference voltage $+E_s$ is connected to resistor $R_d$.

High-pass filter 11 is constituted by a capacitor $C_1$ and a resistor $R_c$, in series, to remove the DC component of the output carrier signal $E_c$ where the fundamental clock pulse generated by clock pulse generator 6 is divided by divider 2. Thus, an integration output error can be prevented. Preferably the time constant ($R_cC_1$) is sufficiently greater than a period T of the carrier signal to prevent such an error.

The operation of the above pulse width controller adopting a feedback PWM integration system that employs a carrier-synchronous signal will now be explained with reference to the drawings.

Among the various types of pulse modulation, pulse width modulation (PWM) is the type where duty factor changes, that is, pulse amplitude and phase are steady while the pulse width changes. Furthermore, PWM modulation methods which effect integration through a feedback loop are divided into a triangular-wave comparison method and a square-wave superimposing method. The basic difference between these two is that a square wave clock (i.e., the carrier) is applied instead of comparing an instantaneous value of a triangular wave.

A feedback PWM integration method that generates and inputs a variable pulse signal that is synchronized with the carrier can be expressed with the following expressions (1.5), (1.6), and (1.7). It can be expressed in a signal waveform diagram FIG. 4A, where the composite signal of FIG. 3A, i.e., the waveform of FIG. 3B, is integrated by integrator 4.

Figure 4A:
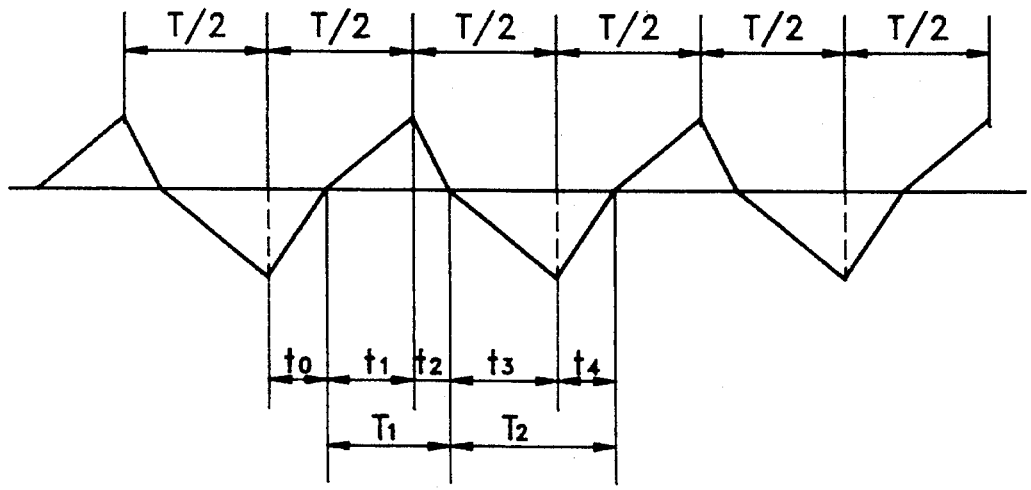
FIG. 4A illustrates the integrated output waveform of the composite signal shown in FIG. 3B according to a preferred embodiment of the present invention.

FIG. 4A is a basic waveform chart of an integrator when the pulse width of the carrier-synchronous signal is zero (that is, $T_i = T_d = 0$). The waveform shown in FIG. 4A is essentially the same as that of the integrator of a conventional pulse width controller adopting a PWM integration system and can be expressed as the following expressions (1.1) to (1.7).

If the time intervals with respect to the zero-crossing points of an output waveform are $t_0, t_1, t_2 \ldots t_n$, and the corresponding slopes for each interval are $K_0, K_1, K_2 \ldots K_n$, the time-slope relationship can be expressed as $$K_1 t_1 = -K_2 t_2 \tag{1.1}$$
$$K_3 t_3 = -K_4 t_4$$
$$K_5 t_5 = -K_6 t_6$$
$$K_{n-1} t_{4n-1} = -K_{4n} t_{4n}$$

and $$t_0 + t_1 = \frac{T}{2} \tag{1.2}$$
$$t_2 + t_3 = \frac{T}{2}$$
$$t_4 + t_5 = \frac{T}{2}$$
$$t_6 + t_7 = \frac{T}{2}$$
$$t_{4n} + t_{4n+1} = \frac{T}{2}$$

where T is one clock cycle, i.e., the period.

In addition, the slopes can be expressed by employing an integration expression with respect to FIG. 1 and FIG. 4A, as follows, provided that $R_x = R_s = R_c = R$.

$$K_1 = \frac{E_c - E_s - E_x}{RC_1} \tag{1.3}$$

$$K_2 = \frac{-E_c - E_s - E_x}{RC_1}$$

$$K_3 = \frac{-E_c + E_s - E_x}{RC_1}$$

$$K_4 = \frac{E_c + E_s - E_x}{RC_1}$$

If one cycle is comprised of slopes $K_1$, $K_2$, $K_3$, and $K_4$, $$K_1 = K_5 = K_3 = \ldots = K_{4n-3} = K_{4N+1} \tag{1.4}$$
$$K_2 = K_6 = K_{10} = \ldots = K_{4n-2} = K_{4N+2}$$
$$K_3 = K_7 = K_{11} = \ldots = K_{4n-1}$$
$$K_4 = K_8 = K_{12} = \ldots = K_{4n}$$

The relation between $T_1$ and $T_2$ and $E_x$, $E_s$, and $E_c$ can be expressed by using expressions (1.1) to (1.4) as follows.

$$T_1 = \frac{T(1 - E_x/E_s)}{2} \tag{1.5}$$

$$T_2 = \frac{T(1 + E_x/E_s)}{2} \tag{1.6}$$

Accordingly, the value of $T_2 - T_1$ has a relationship with the above expressions (1.5) and (1.6), as follows.

$$E_s(T_2 - T_1) = TE_x \tag{1.7}$$

As can be seen from expression (1.7), amplitude $\pm E_c$ of the carrier has no relation to the degree of integration if the carrier synchronization circuit 1 does not exist, i.e., if both $T_i$ and $T_d$ are equal to zero.

FIGS. 3A to 3H illustrate operation waveforms with respect to waveform A+C (or B+C) where negative carrier-synchronous variable pulse signal $E_i$ coincides with the rising edge of carrier signal voltage $E_c$ and illustrate waveform A+D (or B+D) where positive carrier-synchronous variable pulse signal $E_d$ coincides with the falling edge of carrier signal voltage $E_c$, assuming $E_x < E_s < E_c$ and input voltage $E_x$ is positive. A references the composite of the waveforms $E_c$, $E_s$, and $E_x$ shown in FIG. 3A; B references the waveform shown in FIG. 3B; C references the waveform shown in FIG. 3C; and D references the waveform shown in FIG. 3D.

Referring to the integration output waveform shown in FIG. 3E (which corresponds to FIG. 4B), four slope sections (a, b, c and d) correspond to the input voltage. The slope section "a" starts from a timing point delayed from the timing point T/2 by $T_i$ when $-E_c$ changes to $+E_c$, $E_i$ is applied, and the comparator output is high. The signal synchronized with a clock pulse passes through a D flip-flop to set analog switch 9 to the $+E_s$ terminal. In this case, as shown in FIG. 3B, the composite input voltage of integrator 4 is $E_x + E_s + E_c$ and the integration output falls sharply to 0 V.

In slope section "b," comparator 4 detects the zero-crossing point and the comparator output goes low, thereby switching to the $-E_s$ terminal. Here, the composite input voltage is $E_x - E_s + E_c$, and the integration output level changes to a more gradual slope, but remains decreasing.

In slope section "c," the carrier inverses its slope and changes to a $-E_c$ value. Here the comparator output is low, thereby keeping the $-E_s$ terminal selected. Accordingly, the composite input voltage becomes $E_x - E_s - E_c$, and the integration output rises gradually up to 0 V.

In slope section "d," the comparator detects the zero-crossing point, the comparator output goes high, and analog switch 9 stops applying the negative reference voltage and switches to the $+E_s$ terminal. The composite input voltage is then $E_x + E_s - E_c$ and the integration output rises sharply. Accordingly, the integration output returns to the initial value after one cycle, T.

When an integration output waveform is phase-shifted by a distance relevant to $T_i$ and $T_d$ from a half clock cycle (T/2) by applying the basic principles of the PWM integration method, the changes in pulse width are one of two types according to the phase shift. First, the $T_i$-type phase shift will be described.

As shown in FIG. 3E, an integration output waveform rides with the increasing pulse width of $T_i$. Accordingly, the output pulse width of comparator 4 is increased, as shown in FIG. 3G. The case where pulse width $T_i$ of carrier-synchronous variable pulse signal $E_i$ is increased, assuming $T_d = 0$, will be explained with reference to FIG. 4B.

When the carrier-synchronous variable pulse signal (amplitude $T_i$), which is synchronized with the rising edge of each half clock cycle (T/2) of the carrier signal, is applied, the integration output waveform moves a distance corresponding to $T_i$. In this case, expression (1.2) will be modified as follows with respect to each time interval from the zero-crossing point.

$$t_0 + t_1 = \frac{T}{2} + T_i \tag{1.8}$$
$$t_2 + t_3 = \frac{T}{2} - T_i$$
$$t_4 + t_5 = \frac{T}{2} + T_i$$
$$t_6 + t_7 = \frac{T}{2} + T_i$$
$$t_{4n} + t_{4n+1} = \frac{T}{2} + T_i$$

As with expression (1.2), T is one clock cycle.

The value of time interval $t_1$ of FIG. 4B can be expressed as follows with respect to expressions (1.1) and (1.8).

$$t_1 = t_2 \left( \frac{-K_2}{K_1} \right) \tag{1.9}$$

$$t_2 \left( \frac{-K_2}{K_1} \right) = \left( \frac{-K_2}{K_1} \right) \left( \frac{T}{2} - T_i - t_3 \right)$$

$$t_3 \left( \frac{K_2}{k_1} \right) = t_4 \left( \frac{K_2}{K_1} \right) \left( \frac{-K_4}{K_3} \right)$$

-continued $$t_4\left(\frac{-K_2K_4}{K_1K_3}\right) = \left(\frac{-K_2K_1}{K_1K_3}\right)\left(\frac{T}{2} - T_i - t_5\right)$$

$$t_5\left(\frac{K_2K_4}{K_1K_3}\right) = t_6\left(\frac{K_2K_4}{K_1K_3}\right)\left(\frac{-K_6}{K_5}\right)$$

$$t_6\left(\frac{-K_2K_4K_6}{K_1K_2K_5}\right) = \left(\frac{-K_2K_4K_6}{K_1K_2K_5}\right)\left(\frac{T}{2} - T_i - t_7\right)$$

$$t_{4n-1}\left(\frac{K_2K_4\ldots K_{4n-2}}{K_1K_3\ldots K_{4n-3}}\right) = t_{4n}\left(\frac{-K_2K_4\ldots K_{4n}}{K_1K_3\ldots K_{4n-1}}\right)$$

$$t_{4n}\left(\frac{-K_2K_4\ldots K_{4n}}{K_1K_3\ldots K_{4n-1}}\right) =$$

$$\left(\frac{-K_2K_4\ldots K_{4n}}{K_1K_3\ldots K_{4n-1}}\right)\left(\frac{T}{2} - T_i - t_{4n-1}\right)$$

$$t_1 = \frac{T}{2}\left(\frac{-K_2}{K_1}\right)\left[1 + \left(\frac{K_4K_6}{K_3K_5}\right) + \left(\frac{K_4K_6K_8K_{10}}{K_3K_5K_7K_9}\right) + \ldots\right.$$
$$+ \left.\left(\frac{K_4K_6\ldots K_{4n-2}}{K_5K_7\ldots K_{4n-3}}\right)\right] + \frac{T}{2}\left(\frac{-K_2K_4}{K_1K_3}\right)\left[1 + \left(\frac{K_6K_8}{K_5K_7}\right) + \right.$$
$$\left(\frac{K_6K_8K_{10}K_{12}}{K_5K_7K_9K_{11}}\right) + \ldots + \left.\left(\frac{K_6K_8\ldots K_{4n}}{K_5K_7\ldots K_{4n-1}}\right)\right] +$$

$$T_i\left(\frac{K_2}{K_1}\right)\left[1 + \left(\frac{K_4K_6}{K_3K_5}\right) + \left(\frac{K_4K_6K_8K_{10}}{K_3K_5K_7K_9}\right) + \ldots\right.$$
$$+ \left.\left(\frac{K_4K_6\ldots K_{4n-2}}{K_3K_5\ldots K_{4n-3}}\right)\right] + T_i\left(\frac{-K_2K_4}{K_1K_3}\right)\left[1 + \left(\frac{K_6K_8}{K_5K_7}\right) + \right.$$
$$\left(\frac{K_6K_8K_{10}K_{12}}{K_5K_7K_9K_{11}}\right) + \ldots + \left.\left(\frac{K_6K_8\ldots K_{4n}}{K_5K_7\ldots K_{4n-1}}\right)\right] +$$

$$t_{4n-1}\left(\frac{K_2K_4\ldots K_{4n}}{K_1K_3\ldots K_{4n-1}}\right)$$

If the output waveform satisfies the expression (1.4) which constitutes one clock cycle, expression (1.9) can be rearranged as follows, when the value of $k_1k_3/k_2k_4$ is substituted with the variable "a."

$$t_{4n+1} = t_1 a^n + \frac{T}{2}\left(\frac{K_2(K_3 + K_4)}{K_1K_3 - K_2K_4}\right)(a^n - 1) - \quad (1.10)$$
$$T_i\left(\frac{K_2(K_3 - K_4)}{K_1K_3 - K_2K_4}\right)(a^n - 1)$$

The degree of change of $t_{4n+1}$ with respect to a variable pulse can be calculated by expression (1.10). Then, the $t_{4n-1}$ value can be calculated, as follows.

$$t_{4n-1} = t_{4n}\left(\frac{-K_{4n}}{K_{4n-1}}\right) \quad (1.11)$$

$$= \frac{-K_4}{K_3}\left(\frac{T}{2} + T_i - t_{4n+1}\right)$$

If the expression (1.10) is substituted for expression (1.11), then the following expression can be derived.

$$t_{4n-1} = t_1\left(\frac{K_4}{K_3}\right)a^n - \frac{T}{2}\left(\frac{K_4(K_1 + K_2)}{K_1K_3 - K_3K_4}\right)(1 - a^n) - \quad (1.12)$$
$$\frac{T}{2}\left(\frac{K_4}{K_3}\right)a^n - T_i\left(\frac{K_4(K_1 - K_2)}{K_1K_3 - K_2K_4}\right)(1 + a^n) + T_i\left(\frac{K_4}{K_3}\right)$$

The value of time interval $t_{4n+2}$ can be expressed as follows, by applying expression (1.1) to expression (1.10).

$$t_{4n+2} = t_1\left(\frac{-K_1}{K_2}\right)a^n - \frac{T}{2}\left(\frac{K_1(K_3 + K_4)}{K_1K_3 - K_2K_4}\right)(a^n - 1) + \quad (1.13)$$
$$T_i\left(\frac{K_1(K_3 - K_4)}{K_1K_3 - K_2K_4}\right)(a^n - 1)$$

Then, the value of time interval $t_{4n}$ can be expressed as follows, by applying expression (1.1) to expression (1.12).

$$t_{4n} = -t_1 a^n + \frac{T}{2}\left(\frac{K_3(K_1 + K_2)}{K_1K_3 - K_2K_4}\right)(a^n - 1) + \frac{T}{2} a^n + \quad (1.14)$$
$$T_i\left(\frac{K_3(K_1 - K_2)}{K_1K_3 - K_2K_4}\right)(a^n - 1) - T_i a^n$$

When $T_i$ is applied, the slopes form one cycle with respect to movement of an output waveform and the degree of change in the time interval variables with respect to the zero-crossing points are expressed as follows with reference to the above expressions.

(i) The positive pulse period ($t_{4n+1}+t_{4n+2}$) can be obtained by adding expressions (1.10) and (1.13).

$$t_{4n+1} + t_{4n+2} = t_1\left(K_2 - \frac{K_1}{K_2}\right)a^n + \quad (1.15)$$
$$\frac{T}{2}\left(\frac{(K_2 - K_1)(K_3 + K_4)}{K_1K_3 - K_2K_4}\right)(a^n - 1) +$$
$$T_i\left(\frac{(K_1 - K_2)(K_4 + K_3)}{K_1K_3 - K_2K_4}\right)(a^n - 1)$$

(ii) The negative pulse period ($t_{4n-1}+t_{4n}$) can be obtained by adding expressions (1.12) and (1.14).

$$t_{4n-1} + t_{4n} = T_1\left(\frac{K_4 - K_3}{K_3}\right)a^n - \quad (1.16)$$
$$\frac{T}{2}\left(\frac{(K_2 + K_1)(K_4 - K_3)}{K_1K_3 - K_2K_4}\right)(1 - a^n) + \frac{T}{2}\left(\frac{K_3 - K_4}{K_3}\right)a^n -$$
$$T_i\left(\frac{(K_2 - K_1)(K_3 - K_4)}{K_1K_3 - K_2K_4}\right)(1 + a^n) - T_i\left(\frac{K_3 - K_4}{K_3}\right)a^n$$

(iii) $t_{4n+1} + t_{4n+2}(n \to \infty) = T_1$

If a<<1 in expression (1.15), the final terms thereof are arranged when n is at maximum. Then, the relationship between $E_x$, $E_s$, and $E_c$ can be expressed as follows by substituting expression (1.3) for expression (1.15).

$$T_1 = \frac{T}{2}\left(1 - \frac{E_x}{E_s}\right) + T_i\left(\frac{E_c}{E_s}\right) \quad (1.17)$$

If $\frac{E_c}{E_s}$ is $\alpha$, then $$T_1 = \frac{T}{2}\left[1 - \left(\frac{E_x}{E_s}\right)\right] + \alpha T_i \quad (1.18)$$

Here, an arbitrary constant $\alpha$ is a movement coefficient of the output waveform and is calculated by dividing the carrier voltage value by the reference voltage value. The value of $\alpha$ is constant with respect to changes in the $T_i$ value. Accordingly, if the $T_i$ time interval increases, the $T_2$ pulse width is increased by an amount corresponding to $\alpha T_i$.

$$t_{4n-1}+t_{4n}(n \to \infty)=T_2 \quad \text{(iv)}$$

If a<<1 in expression (1.16), the final value is operated when n is at maximum. Then, the relationship between $E_x$, $E_s$, and $E_c$ can be expressed as follows, by substituting expression (1.3) for expression (1.16).

$$T_2 = \frac{T}{2}\left(1 + \frac{E_x}{E_s}\right) - T_i\left(\frac{E_c}{E_s}\right) \quad (1.19)$$

As can be seen in expression (1.19), $T_i$ with respect to $T_2$ has the opposite sign as compared with $T_i$ with respect to $T_1$. Accordingly, if the pulse width of $T_i$ is increased, the pulse width of $T_2$ decreases by an amount corresponding to a $\alpha T_i$.

(v) The value of $T_2-T_1$ can be expressed as follows, with reference to expressions (1.17) and (1.19).

$$E_s(T_2-T_1) = TE_x - 2T_i E_c \quad (1.20)$$

The description thus far considers cases where the pulse width is increased. However, if a circuit is designed regarding a pulse width change as $T_1$, the pulse width of $T_1$ is increased if an applied pulse width $T_i$ is increased.

To set the $\alpha$ value for maintaining the original waveform shape of the integrator output and establishing linearity with respect to changes in input level or the pulse width of $T_i$, a negative pulse signal in synchronization with the carrier ($E_c$) is applied.

The number of reference clock pulses are counted by employing a counter circuit during the period corresponding to time variables $T_1$, $T_2$, and $T_2-T_1$ of the pulse width of the feedback PWM integration method defined by expressions (1.17) to (1.20).

Next, the $T_d$-type phase shift will be described.

Here, the pulse width of $T_d$ is increased and the integrated output waveform goes negative as shown in FIG. 3F. As a result, the pulse width of comparator 4 decreases as shown in FIG. 3H. The case where pulse width $T_d$ of carrier-synchronous variable pulse signal $E_d$ is decreased will be explained with reference to FIG. 4C, assuming $T_i=0$.

The case where the carrier-synchronous variable pulse signal, in sync with the falling edges of the half clock cycle (T/2) of the carrier signal, is applied and an output waveform moves a distance corresponding to $T_d$, can be expressed as follows.

$$t_0 + t_1 = \frac{T}{2} + T_d \quad (1.21)$$

$$t_2 + t_3 = \frac{T}{2} - T_d$$

$$t_4 + t_5 = \frac{T}{2} + T_d$$

$$t_6 + t_7 = \frac{T}{2} + T_d$$

$$t_{4n} + t_{4n+1} = \frac{T}{2} + T_d$$

The value of time interval $t_1$ shown in FIG. 4C can be expressed as follows, according to expression (1.9).

$$t_1 = \quad (1.22)$$

$$\frac{T}{2}\left(\frac{-K_2}{K_1}\right)\left[1 + \left(\frac{-K_4 K_6}{K_3 K_5}\right) + \left(\frac{-K_4 K_6 K_8 K_{10}}{K_3 K_5 K_7 K_9}\right) + \ldots + \left(\frac{K_4 K_6 \ldots K_{4n-2}}{K_5 K_7 \ldots K_{4n-3}}\right)\right] +$$

$$\frac{T}{2}\left(\frac{-K_2 K_4}{K_1 K_3}\right)\left[1 + \left(\frac{K_6 K_8}{K_5 K_7}\right) + \left(\frac{-K_6 K_8 K_{10} K_{12}}{K_5 K_7 K_9 K_{11}}\right) + \ldots +\right.$$

$$\left.\left(\frac{K_4 K_6 \ldots K_{4n}}{K_3 K_5 \ldots K_{4n-1}}\right)\right] +$$

$$T_d\left(\frac{-K_2}{K_1}\right)\left[1 + \left(\frac{-K_4 K_6}{K_3 K_5}\right) + \left(\frac{-K_4 K_6 K_8 K_{10}}{K_3 K_5 K_7 K_9}\right) + \ldots + \left(\frac{K_4 K_6 \ldots K_{4n-2}}{K_3 K_5 \ldots K_{4n-3}}\right)\right] +$$

$$\frac{T}{2}\left(\frac{-K_2 K_4}{K_1 K_3}\right)\left[1 + \left(\frac{K_6 K_8}{K_5 K_7}\right) + \left(\frac{-K_6 K_8 K_{10} K_{12}}{K_5 K_7 K_9 K_{11}}\right) + \ldots + \left(\frac{K_4 K_6 \ldots K_{4n}}{K_3 K_5 \ldots K_{4n-1}}\right)\right] + t_{4n+1}\left(\frac{K_2 K_4 \ldots K_{4n}}{K_1 K_3 \ldots K_{4n-1}}\right)$$

The terms of expression (1.22) can be arranged as follows, when the expression (1.4) for constituting one cycle of the output waveform is satisfied.

$$t_{4n+1} = t_1 a^n + \frac{T}{2}\left(\frac{K_2(K_3' K_4)}{K_1 K_3 - K_2 K_4}\right)(a^n - 1) + \quad (1.23)$$

$$T_d\left(\frac{K_2(K_3 - K_4)}{K_1 K_3 - K_2 K_4}\right)(a^n - 1)$$

Then, the values of $t_{4n-1}$, $t_{4n+2}$, and $t_{4n}$ can be determined as follows.

$$t_{4n-1} = \quad (1.24)$$

$$t_1\left(\frac{K_4}{K_3}\right)a^n - \frac{T}{2}\left(\frac{K_4(K_1 + K_2)}{K_1 K_3 - K_2 K_4}\right)(1 - a^n) -$$

$$\frac{T}{2}\left(\frac{K_4}{K_3}\right)a^n + T_d\left(\frac{K_4(K_1 - K_2)}{K_1 K_3 - K_2 K_4}\right)(1 + a^n) -$$

$$T_d\left(\frac{K_4}{K_3}\right)a^n$$

$$t_{4n+2} = \quad (1.25)$$

$$t_1 a^n\left(\frac{-K_1}{K_2}\right) - \frac{T}{2}\left(\frac{K_1(K_3 + K_4)}{K_1 K_3 - K_2 K_4}\right)(a^n - 1) -$$

$$T_d\left(\frac{K_1(K_3 - K_4)}{K_1 K_3 - K_2 K_4}\right)(a^n - 1)$$

$$t_{4n} = -t_1 a^n + \quad (1.26)$$

$$\frac{T}{2}\left(\frac{K_3(K_1 + K_2)}{K_1 K_3 - K_2 K_4}\right)(1 - a^n) +$$

$$\frac{T}{2} a^n - T_d\left(\frac{K_3(K_1 - K_2)}{K_1 K_3 - K_2 K_4}\right)(1 + a^n) - T_d a^n$$

The above expressions show that the slopes form one cycle upon moving an integration output waveform and time interval when the carrier-synchronous variable pulse signal whose amplitude is $T_d$ is applied.

(i) The positive pulse period ($t_{4n+1}+t_{4n+2}$) can be expressed as follows, by adding expressions (1.23) and (1.25).

$$t_{4n+1} + t_{4n+2} = \quad (1.27)$$

$$t_1\left(\frac{K_2 K_1}{K_2}\right)a^n + \frac{T}{2}\left(\frac{(K_2 - K_1)(K_3 + K_4)}{K_1 K_3 - K_2 K_4}\right)(a^n - 1) +$$

$$T_d\left(\frac{(K_1 - K_2)(K_4 + K_3)}{K_1 K_3 - K_2 K_4}\right)(a^n - 1)$$

(ii) the negative pulse period ($t_{4n-1}-t_{4n}$) can be expressed as follows.

$$t_{4n-1} + t_{4n} = \quad (1.28)$$

$$t_1\left(\frac{K_4-K_3}{K_3}\right)a^n - \frac{T}{2}\left(\frac{(K_2+K_1)(K_4-K_3)}{K_1K_3-K_2K_4}\right)(1-a^n) +$$

$$\frac{T}{2}\left(\frac{K_4-K_3}{K_3}\right)a^n + T_d\left(\frac{(K_2-K_1)(K_3+K_4)}{K_1K_3-K_2K_4}\right)(1+a^n) +$$

$$T_d\left(\frac{K_3-K_4}{K_3}\right)a^n$$

$$t_{4n+1} + t_{4n+2}(n\to\infty) = T_1 \quad \text{(iii)}$$

If a<<1 in expression (1.27), the final terms thereof when n is at maximum can be arranged by applying expression (1.3) as follows.

$$T_1 = \frac{T}{2}\left(1 - \frac{E_x}{E_s}\right) - T_d\left(\frac{E_c}{E_s}\right) \quad (1.29)$$

If $E_c/E_s = \beta$, then $$T_1 = \frac{T}{2}\left(1 - \frac{E_x}{E_s}\right) - \beta T_d \quad (1.30)$$

Here, an arbitrary constant β is a movement coefficient of the output waveform and is calculated by dividing a carrier voltage value by the reference voltage value. Accordingly, if the $T_d$ time interval is extended, the $T_i$ time interval is reduced by $\beta T_d$. As compared with expression (1.18), β has the opposite signal but the same value as α.

$$t_{4n-1}+t_{4n}(n\to\infty)=T_2 \quad \text{(iv)}$$

If a<<1 in expression (1.28), the final terms thereof when n is at maximum can be arranged by applying expression (1.3) as follows.

$$T_2 = \frac{T}{2}\left(1 + \frac{E_x}{E_s}\right) + T_d\left(\frac{E_c}{E_s}\right) \quad (1.31)$$

As can be seen in expression (1.31), $T_d$ with respect to $T_2$ has the opposite sign of $T_1$. Accordingly, if the pulse width of $T_d$ is increased, the pulse width of $T_2$ decreases.

(v) The relation between $T_2-T_1$ and $E_s$, $E_x$, and $E_c$ with respect to expressions (1.29) and (1.30) can be expressed as follows.

$$E_s(T_2-T_1)=TE_x+2T_dE_c \quad (1.32)$$

Expressions for the case of reducing the pulse width have been discussed thus far. If a circuit is designed based on the pulse width change for $T_1$, the pulse width of $T_1$ is reduced when an applied pulse width ($T_d$) is increased.

To maintain the original shape of an integrator output waveform and have linearity with respect to changes in the input or pulse width $T_i$, the integrator output waveform has to be synchronized with the carrier signal.

The number of reference clock pulses are counted by employing a counter circuit during the period corresponding to time variables $T_1$, $T_2$, and $T_2-T_1$ of pulse width of the feedback PWM integration method defined by expressions (1.17) to (1.20)

Since the comparator output has a "blind" voltage area, the output of the comparator when the reference voltage of the input is zero does not output as an inverse signal to the zero level of the integrator output. Therefore, a difference between an ideal state and an inverse state is caused. That is, an inverse waveform is phase- delayed. Accordingly, to satisfy expressions (1.17) and (1.29), each input to the integrator must be zero. Therefore, if a feedback voltage ($E_d$ or $E_i$) is selected by a convergence point of integrator input, the expressions (1.17) and (1.29) are satisfied, thereby returning the phase location to a real inversion operation point.

The phases of the feedback PWM waveform of the carrier signal synchronized pulse and clock signal square wave are related as follows.

Figure 4B:
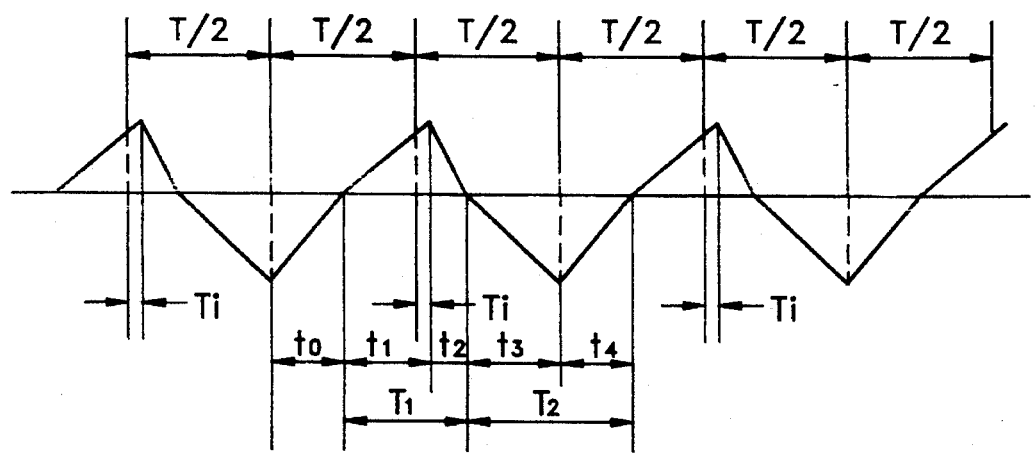
FIG. 4B illustrates the integrated output waveform of the composite signal of FIG. 3B and the negative carrier-synchronous variable pulse signal of FIG. 3C according to a preferred embodiment of the present invention.
Figure 4C:
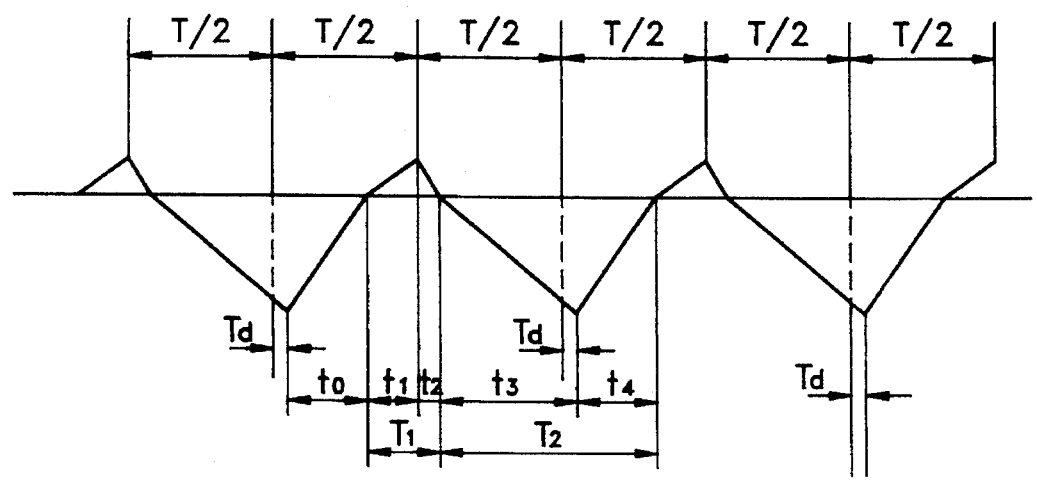
FIG. 4C illustrates the integrated output waveform of the composite signal of FIG. 3B and the positive carrier-synchronous variable pulse signal of FIG. 3D according to a preferred embodiment of the present invention.

First, considering the phase with respect to the carrier signal, the values of $t_1$, $t_2$, $t_3$, and $t_4$ can be expressed by applying expression (1.3) for the case of moving an output waveform a distance corresponding to $T_i$ from a half clock cycle in synchronization with the carrier's rising edge, as in FIG. 4B. This is shown in expression (2.1).

$$t_1 = T\left(\frac{E_c(E_s-E_x)+E_s^2-E_x^2}{4E_cE_s}\right) + T_i\left(\frac{E_c+E_s+E_x}{2E_s}\right) \quad (2.1)$$

$$t_2 = T\left(\frac{E_c(E_s-E_x)-E_s^2+E_x^2}{4E_cE_s}\right) + T_i\left(\frac{E_c-E_s-E_x}{2E_s}\right)$$

$$t_3 = T\left(\frac{E_c(E_s+E_x)+E_s^2-E_x^2}{4E_cE_s}\right) - T_i\left(\frac{E_c+E_s-E_x}{2E_s}\right)$$

$$t_4 = T\left(\frac{E_c(E_s+E_x)-E_s^2+E_x^2}{4E_cE_s}\right) - T_i\left(\frac{E_c-E_s+E_x}{2E_s}\right)$$

The expression (2.1) applies to the case where $t_1$, $t_2$, $t_3$, and $t_4$ change by the carrier synchronous variable pulse signal width $T_i$ and when $E_c$, $E_s$, and $E_x$ are constant.

For moving an output waveform a distance corresponding to $T_d$ from each half clock cycle in synchronization with the carrier's falling edge, as in FIG. 4C, the values of $t_1$, $t_2$, $t_3$, and $t_4$ can be expressed as follows by applying expression (1.3).

$$t_1 = T\left(\frac{E_c(E_s-E_x)+E_s^2-E_x^2}{4E_cE_s}\right) + T_d\left(\frac{E_c+E_s+E_x}{2E_s}\right) \quad (2.2)$$

$$t_2 = T\left(\frac{E_c(E_s-E_x)-E_s^2+E_x^2}{4E_cE_s}\right) + T_d\left(\frac{E_c-E_s-E_x}{2E_s}\right)$$

$$t_3 = T\left(\frac{E_c(E_s+E_x)+E_s^2-E_x^2}{4E_cE_s}\right) - T_d\left(\frac{E_c+E_s-E_x}{2E_s}\right)$$

$$t_4 = T\left(\frac{E_c(E_s+E_x)-E_s^2+E_x^2}{4E_cE_s}\right) - T_d\left(\frac{E_c-E_s+E_x}{2E_s}\right)$$

Expression (2.2) applies to the case where $t_1$, $t_2$, $t_3$, and $t_4$ change by the carrier synchronous variable pulse signal width $T_d$ and when $E_c$, $E_s$, and $E_x$ are constant.

Now, with respect to the relationship between $t_1/t_2$ and $t_3/t_4$, if $E_x=0$ V and $E_c=2E_s$ in expression (2.1), the relation of $t_1/t_2$ to $t_3/t_4$ can be expressed as follows.

$$\frac{t_1}{t_2} = \frac{T\left(\frac{E_cE_s+E_s^2}{4E_cE_s}\right) + T_i\left(\frac{E_c+E_s}{2E_s}\right)}{T\left(\frac{E_cE_s-E_s^2}{4E_cE_s}\right) + T_i\left(\frac{E_c-E_s}{2E_s}\right)} = 3 \quad (2.3)$$

$$\frac{t_3}{t_4} = \frac{T\left(\frac{E_cE_s+E_s^2}{4E_cE_s}\right) - T_i\left(\frac{E_c+E_s}{2E_s}\right)}{T\left(\frac{E_cE_s-E_s^2}{4E_cE_s}\right) - T_i\left(\frac{E_c-E_s}{2E_s}\right)} = 3$$

As can be seen from expression (2.3), $t_1$ is three times $t_2$ and $t_3$ is three times $t_4$.

If $E_x=0$ V and $E_c=2E_s$ in expression (2.2), the relation of $t_1/t_2$ to $t_3/t_4$ can be expressed as follows.

$$\frac{t_1}{t_2} = \frac{T\left(\frac{E_c E_s + E_s^2}{4E_c E_s}\right) + T_d\left(\frac{E_c + E_s}{2E_s}\right)}{T\left(\frac{E_c E_s - E_s^2}{4E_c E_s}\right) + T_d\left(\frac{E_c - E_s}{2E_s}\right)} \quad (2.4)$$

$$= 3$$

$$\frac{t_3}{t_4} = \frac{T\left(\frac{E_c E_s + E_s^2}{4E_c E_s}\right) - T_d\left(\frac{E_c + E_s}{2E_s}\right)}{T\left(\frac{E_c E_s - E_s^2}{4E_c E_s}\right) - T_d\left(\frac{E_c - E_s}{2E_s}\right)}$$

$$= 3$$

As can be seen from expression (2.4), $t_1$ is three times $t_2$ and $t_3$ is three times $t_4$.

Finally, the effect of changes in $T_i$, $T_d$, and $E_x$ on PWM modulation will now be described.

In expression (2.1), the change in each time width can be differentiated by $T_d$ and is expressed as follows.

$$\frac{\partial t_1}{\partial T_i} = \frac{E_c + E_s + E_x}{2E_s} \quad (2.5)$$

$$\frac{\partial t_2}{\partial T_i} = \frac{E_c - E_s - E_x}{2E_c}$$

$$\frac{\partial t_3}{\partial T_i} = \frac{E_c + E_s - E_x}{2E_s}$$

$$\frac{\partial t_4}{\partial T_i} = \frac{E_c + E_s - E_x}{2E_c}$$

$$\frac{\partial(t_1 + t_2)}{\partial T_i} = \frac{\partial T_1}{\partial T_i} = \frac{-E_c}{E_s}$$

$$\frac{\partial(t_3 + t_4)}{\partial T_i} = \frac{\partial T_2}{\partial E_c} = \frac{E_c}{E_s}$$

In expression (2.2), the change in each time width can be differentiated by Td and is expressed as follows.

$$\frac{\partial t_1}{\partial T_d} = \frac{-(E_c + E_s + E_x)}{2E_s} \quad (2.6)$$

$$\frac{\partial t_2}{\partial T_d} = \frac{-(E_c - E_s - E_x)}{2E_c}$$

$$\frac{\partial t_3}{\partial T_d} = \frac{-(E_c + E_s - E_x)}{2E_s}$$

$$\frac{\partial t_4}{\partial T_d} = \frac{-(E_c + E_s - E_x)}{2E_c}$$

$$\frac{\partial(t_1 + t_2)}{\partial T_d} = \frac{\partial T_1}{\partial T_d} = \frac{-E_c}{E_s}$$

$$\frac{\partial(t_3 + t_4)}{\partial T_d} = \frac{\partial T_2}{\partial E_c} = \frac{E_c}{E_s}$$

As can be seen from the expressions (2.5) and (2.6), the PWM-modulated positive and negative portions ($T_1$ and $T_2$) become $E_c/E_s$ and $-E_c/E_s$, respectively, by the carrier synchronous variable pulse width $T_i$.

As for $T_i$, the change in each carrier synchronous variable pulse signal caused by a change in $E_x$ can be differentiated and, if $E_c=E_x$, is expressed as follows.

$$t_1 = \frac{-T}{2E_s} + \frac{T_i}{2E_s} \quad (2.7)$$

$$t_2 = \frac{-T_i}{2E_s}$$

$$t_3 = \frac{T_i}{2E_s}$$

$$t_4 = \frac{T}{2E_s} - \frac{T_i}{2E_s}$$

Change in each carrier synchronous variable pulse signal caused by a change in $E_x$ can be differentiated and, if $E_x=0$, is expressed as follows.

$$t_1 = \frac{-T}{4E_s} + \frac{T_i}{2E_s} \quad (2.8)$$

$$t_2 = \frac{-T_i}{4E_s} - \frac{T_i}{2E_s}$$

$$t_3 = \frac{T}{4E_s} + \frac{T_i}{2E_s}$$

$$t_4 = \frac{T}{4E_s} - \frac{T_i}{2E_s}$$

As for $T_d$, the change in each carrier-synchronous variable pulse signal caused by a change in $E_x$ can be differentiated and, if $E_c=2E_x$, is expressed as follows.

$$t_1 = \frac{-T}{2E_s} - \frac{T_d}{2E_s} \quad (2.9)$$

$$t_2 = \frac{T_d}{2E_s}$$

$$t_3 = \frac{-T_d}{2E_s}$$

$$t_4 = \frac{T}{2E_s} + \frac{T_d}{2E_s}$$

The change in each carrier-synchronous variable pulse signal caused by a change in $E_x$ can be differentiated and, if $E_x=0$, is expressed as follows.

$$t_1 = \frac{-T}{4E_s} - \frac{T_i}{2E_s} \quad (2.10)$$

$$t_2 = \frac{-T_i}{4E_s} + \frac{T_d}{2E_s}$$

$$t_3 = \frac{T}{4E_s} - \frac{T_d}{2E_s}$$

$$t_4 = \frac{T}{4E_s} + \frac{T_d}{2E_s}$$

As can be seen from expressions (2.9) and (2.10), $T_d$ is not affected by a change in input voltage $E_x$.

The cases where $E_c=2E_x$ and where $E_x=0$ are differentiated in order to check the relationship between the maximum and minimum outputs. Here, it should be noted that $T_i$ and $T_d$ are not affected by a change in $E_x$. Also, the value of $t_2$ has the maximum value for the case of $T_i$, while $t_3$ has the maximum value for the case of $T_d$. Here, the above-cases, i.e., when $E_c=2E_x$ and when $E_x=0$, result in a negative value, which causes an overflow. This can be found in the circuit design. Accordingly, it is possible to set up an input range which is not necessarily symmetrical with respect to zero.

FIG. 2 shows a circuit design of the pulse width controller of FIG. 1, adopting a feedback PWM integration method employing a carrier-synchronous signal.

1. For increasing pulse width, the coefficient α is determined by applying expression (1.17), as follows.

$$T_1 = \frac{T}{2}\left(1 - \frac{E_x}{E_s}\right) + T_i\left(\frac{E_c}{E_s}\right) \quad (2.11)$$

In the preferred embodiment, as shown in FIG. 2, ($E_c/E_s$) is the value of movement coefficient α. Preferably, if Rc is not equal to Rs, then $R_i$=57.6Ω, $E_i$=−12 V, and α has a value of −2.082.

2. For pulse width reduction, coefficient β is determined by applying expression (1.29), as follows.

$$T_1 = \frac{T}{2}\left(1 - \frac{E_x}{E_s}\right) + T_d\left(\frac{E_c}{E_s}\right) \quad (2.12)$$

In the preferred embodiment, as shown in FIG. 2, ($E_c/E_s$) is the value of movement coefficient β. Preferably, if Rc is not equal to Rs, $R_i$=24Ω, $E_d$=+5 V and β has a value of 2.082.

The pulse width of a carrier-synchronous variable pulse signal synchronized with carrier signal $E_c$ is adjusted by employing a monostable multivibrator circuit.

Meanwhile, the following tables are based on $T_1$ according to three values of input voltage FS after calculating the PWM parameter value. The "K" values appearing below each table are measurements of the slope.

TABLE 1

| (FS =+2 V) | | |
|---|---|---|
| | $T_1$ pulse width enlarged | $T_1$ pulse width reduced |
| $t_1$ | 0.191T + 1.823$T_i$ | 0.191T − 1.823$T_d$ |
| $t_2$ | 0.277T + 0.259$T_i$ | 0.277T − 0.259$T_d$ |
| $t_3$ | 0.473T − 1.259$T_i$ | 0.473T + 1.259$T_d$ |
| $t_4$ | 0.309T − 0.823$T_i$ | 0.309T + 0.823$T_d$ |
| $T_1$ | 0.218T + 2.082$T_i$ | 0.218 − 2.082$T_d$ |
| $T_2$ | 0.782T − 2.082$T_i$ | 0.782 + 2.082$T_d$ |

$K_1$ =−0.026; $K_2$ =0.182; $K_3$ =0.082; $K_4$ =0.126

TABLE 2

| (FS =0 V) | | |
|---|---|---|
| | $T_1$ pulse width enlarged | $T_1$ pulse width reduced |
| $t_1$ | 0.388T + 1.503$T_i$ | 0.388T − 1.503$T_d$ |
| $t_2$ | 0.150T + 0.579$T_i$ | 0.150T − 0.579$T_d$ |
| $t_3$ | 0.350T − 0.503$T_i$ | 0.350T + 0.503$T_d$ |
| $t_4$ | 0.112T − 1.597$T_i$ | 0.112T − 1.579$T_d$ |
| $T_1$ | 0.538T + 2.082$T_i$ | 0.538T − 2.082$T_d$ |
| $T_2$ | 0.782T − 2.082$T_i$ | 0.782T + 2.082$T_d$ |

$K_1$ =0.058; $K_2$ =0.150; $K_3$ =0.050; $K_4$ =0.158

TABLE 3

| (FS =−2 V) | | |
|---|---|---|
| | $T_1$ pulse width enlarged | $T_1$ pulse width reduced |
| $t_1$ | 0.487T + 1.823$T_i$ | 0.487T − 1.183$T_d$ |
| $t_2$ | 0.371T + 0.899$T_i$ | 0.371T − 0.899$T_d$ |
| $t_3$ | 0.129T − 1.899$T_i$ | 0.129T − 1.899$T_d$ |
| $t_4$ | 0.013T − 0.183$T_i$ | 0.013T − 0.183$T_d$ |
| $T_1$ | 0.858T + 2.082$T_i$ | 0.858T − 2.082$T_d$ |
| $T_2$ | 0.142T − 2.082$T_i$ | 0.142T + 2.082$T_d$ |

$K_1$ =0.026; $K_2$ =−0.182; $K_3$ =0.082; $K_4$ =−0.126

In general, the width of $T_1$ and $T_2$ according to an input voltage can be expressed as follows, based on a basic expression of PWM integrating output.

When the input voltage is +FS, $T_1$=0.218T and $T_2$=0.782T.
When the input voltage is zero, $T_1$=0.538T and $T_2$=0.462T.
When the input voltage is −FS, $T_1$=0.858T and $T_2$=0.142T.

In tables 1, 2, and 3, however, expressions for changing pulse width of $T_1$ and $T_2$ are obtained by applying a pulse voltage which is synchronous with the carrier signal and employing variables such as $T_i$ and $T_d$.

Figure 5A:
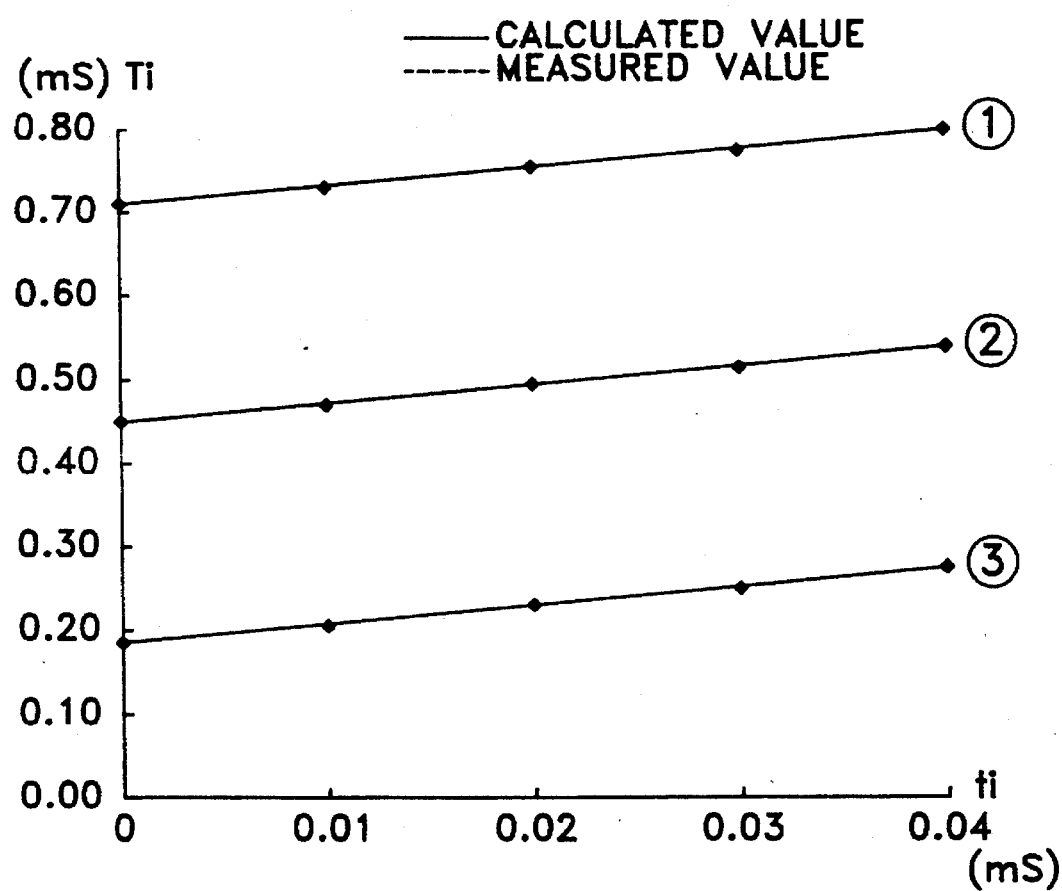
FIGS. 5A and 5B are graphs showing the change in pulse width $T_1$ with respect to pulse width $T_i$ of the negative carrier-synchronous variable pulse signal according to a preferred embodiment of the present invention.
Figure 5B:
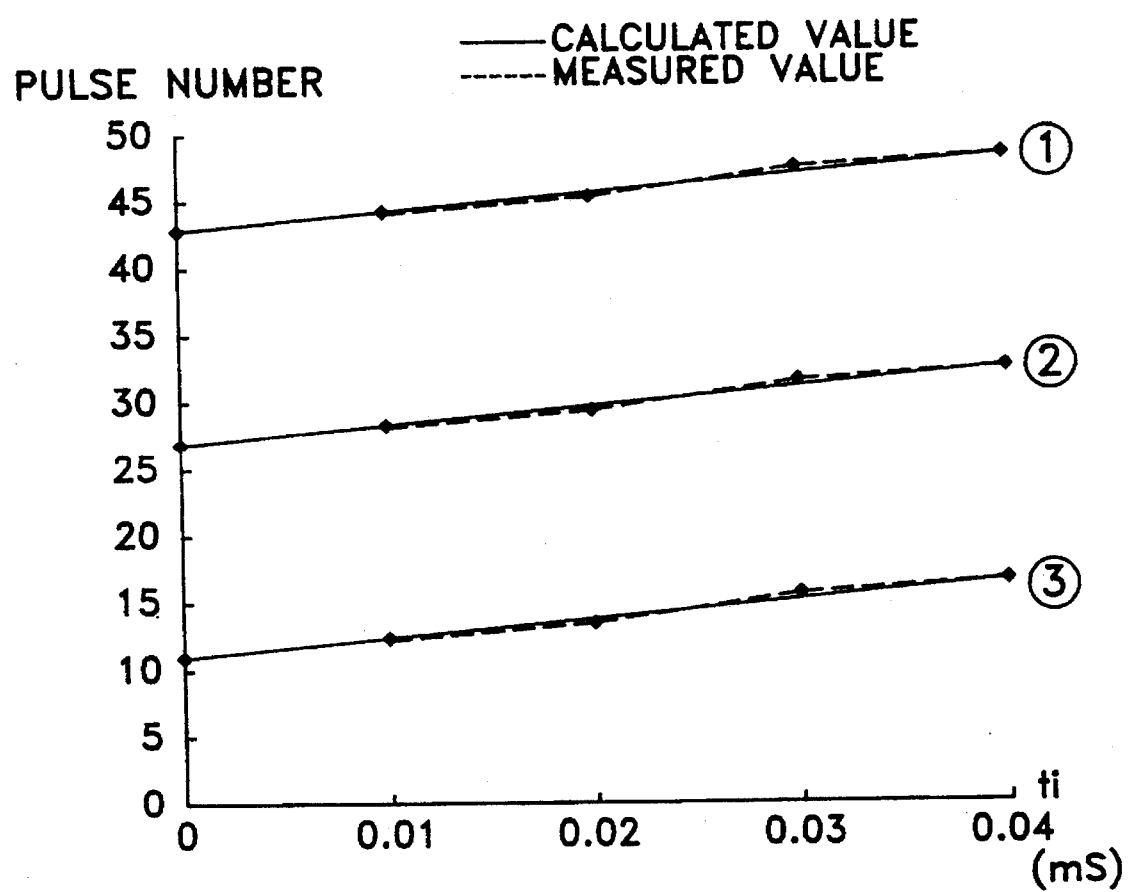
Figure 6A:
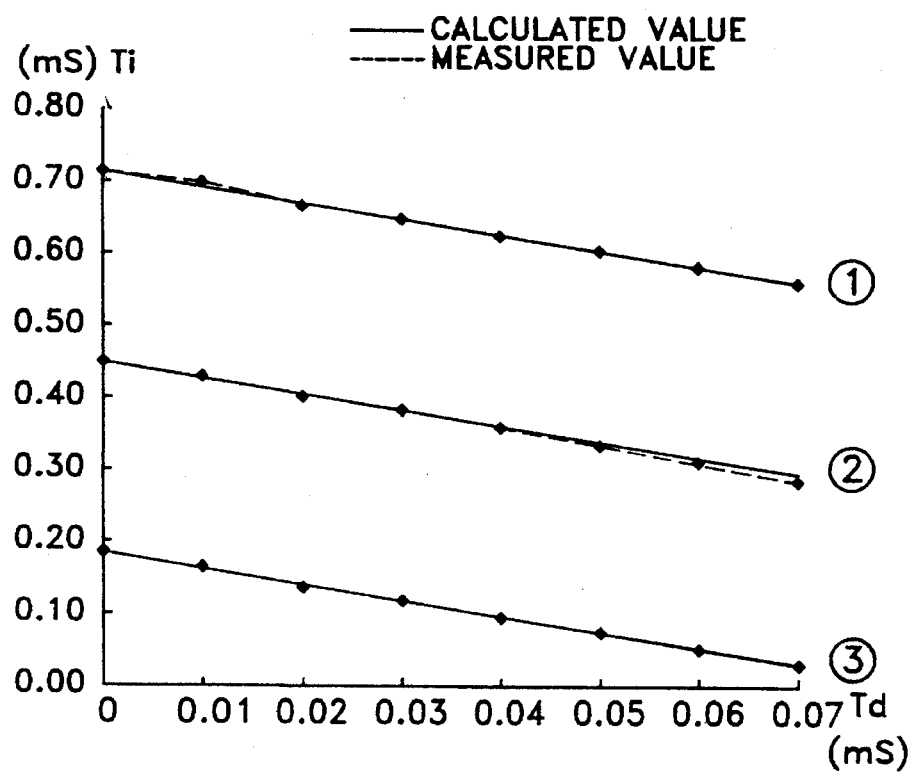
FIGS. 6A and 6B are graphs showing the change in pulse width $T_1$ with respect to pulse width $T_d$ of the positive carrier-synchronous variable pulse signal according to a preferred embodiment of the present invention.
Figure 6B:
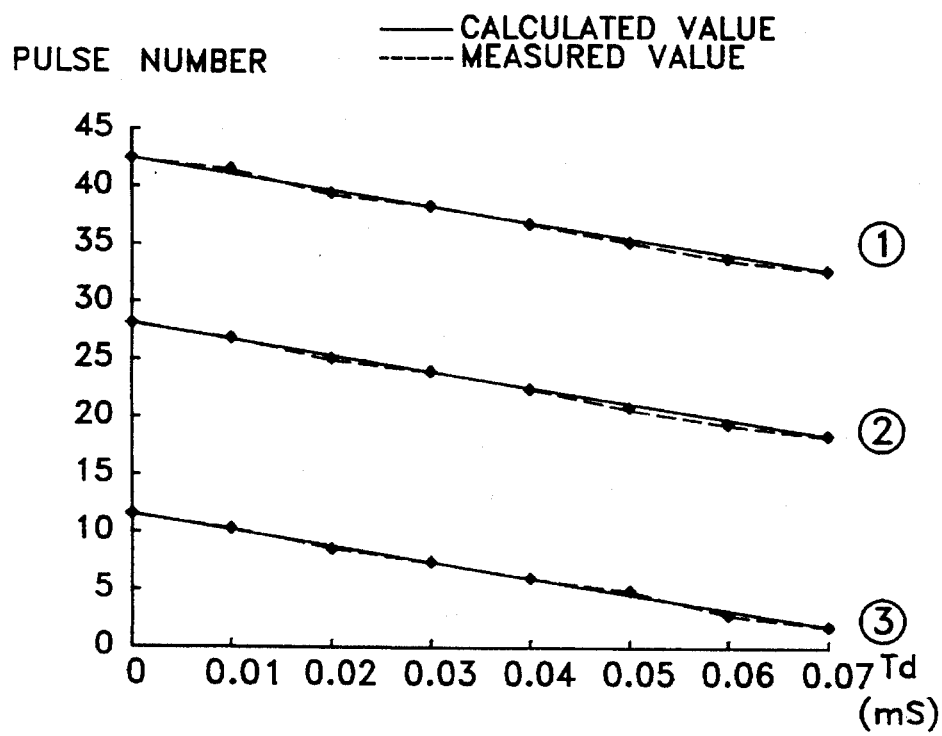

FIGS. 5A and 5B are graphs illustrating a change of pulse width of $T_1$ with respect to pulse width $T_i$ of the negative carrier synchronous variable pulse signal in synchronization with the rising edges of the carrier. FIGS. 6A and 6B are graphs illustrating a change of pulse width of $T_1$ with respect to pulse width $T_d$ of the positive carrier-synchronous variable pulse signal in synchronization with the falling edges of the carrier. These graphs have been obtained through the following procedure.

Pulse width was measured at three points of the input voltage $E_x$: at the full-scale positive input voltage +FS (i.e., 2 V), at the zero-crossing point (0 V), and at the full-scale negative input voltage −FS (i.e., −2 V). Then, the time of a variable pulse width was adjusted while maintaining a regular input voltage and a pulse width of feedback PWM integration method was measured. The pulses were counted on an oscilloscope via a gate circuit having a carrier frequency of 1.2 KHz and a fundamental clock frequency (Four) of 60 KHz.

FIG. 5A shows that pulse width of $T_1$ increases linearly according to a change of variable pulse signal width $T_i$ if an input voltage is fixed. FIG. 5B shows the width $T_1$ of positive pulses of PWM according to each input voltage, and reference clock pulses which are counted according to a change of $T_i$. In FIG. 5B the number of pulses increases linearly as $T_i$ increases.

FIG. 6A shows that pulse width of $T_1$ decreases linearly according to a change of variable pulse voltage width $T_d$ with fixed input voltage. FIG. 6B shows pulse width $T_1$ of an amount of PWM according to each input voltage, and reference clock pulses which are counted according to a change of $T_d$. The number of pulses in FIG. 6B decreases linearly as $T_d$ increases.

Figure 7:
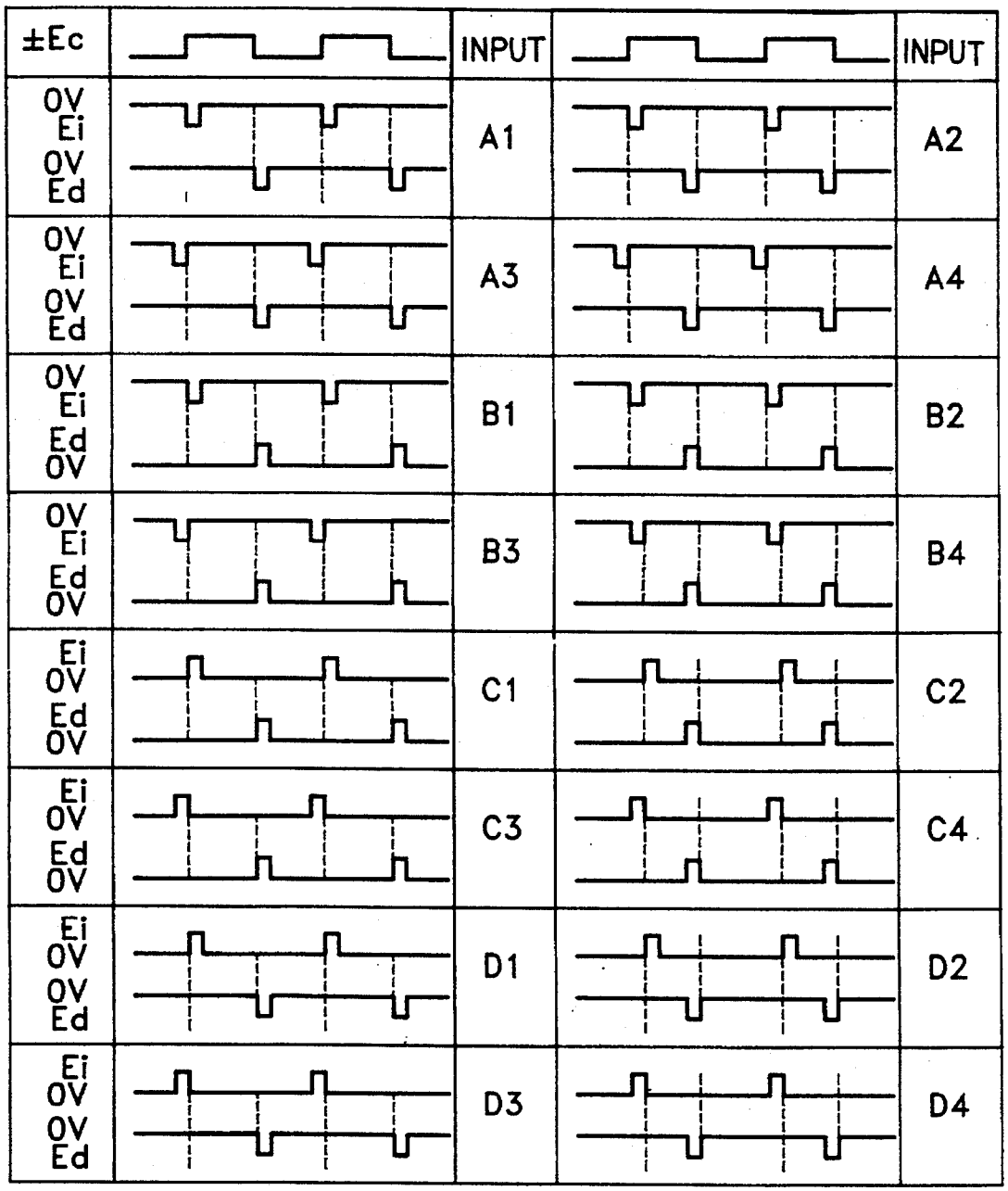
FIG. 7 shows numerous variations of the carrier-synchronous variable pulse signal according to a pulse voltage code and carrier synchronization according to a preferred embodiment of the present invention.

FIG. 7 is a carrier synchronous variable pulse signal classification table where methods for applying the carrier-synchronous variable pulse signal are classified into 16 kinds according to a code signal of a pulse voltage and a carrier synchronization location. The present preferred embodiment of the invention employs the B1 method.

Experimental results for a pulse width controller of the present invention are as follows, wherein the pulse width values of the output waveforms are tabulated and compared.

TABLE 4

| | $T_i =$ $T_d =$ $T_d =0$ $α =β =$ 0 | $T_i =$ $T_d =$ 32 μs $α =β =$ − | $T_i =$ $T_d =$ 32 μs $α =−$ $β =+$ | $T_i =$ $T_d =$ 32 μs $α =β =$ + | $T_i =$ $T_d =$ 32 μs $α =+$ $β =−$ |
|---|---|---|---|---|---|
| +FS (+2 V) | 180 μs | 316 μs | 180 μs | over-flow | 180 μs |
| zero (0 V) | 444 μs | 580 μs | 444 μs | 312 μs | 444 μs |
| FS (−2 V) | 708 μs | over-flow | 708 μs | 580 μs | 708 μs |

As can be seen in the above Table 4, an overflow occurs when α and β are both negative when the input voltage is −2

V, or when α and β are both positive when the input voltage is +2 V.

In addition, when α and β have equal values and opposite signs, their values cancel each other. Thus, the case where a variable pulse is applied has the same pulse width but a different output waveform with respect to the case where a variable pulse is not applied (α=β=0).

Figure 8A:
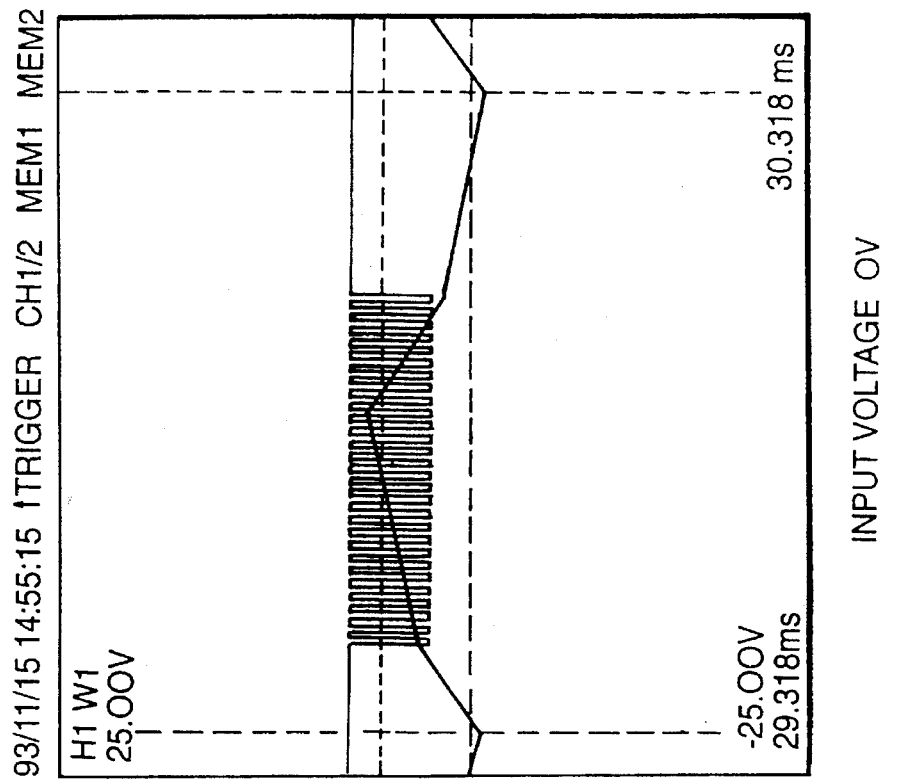
FIGS. 8A–8C illustrate the waveform of a PWM signal output from an actual circuit when a carrier-synchronous variable pulse signal is not applied.
Figure 8B:
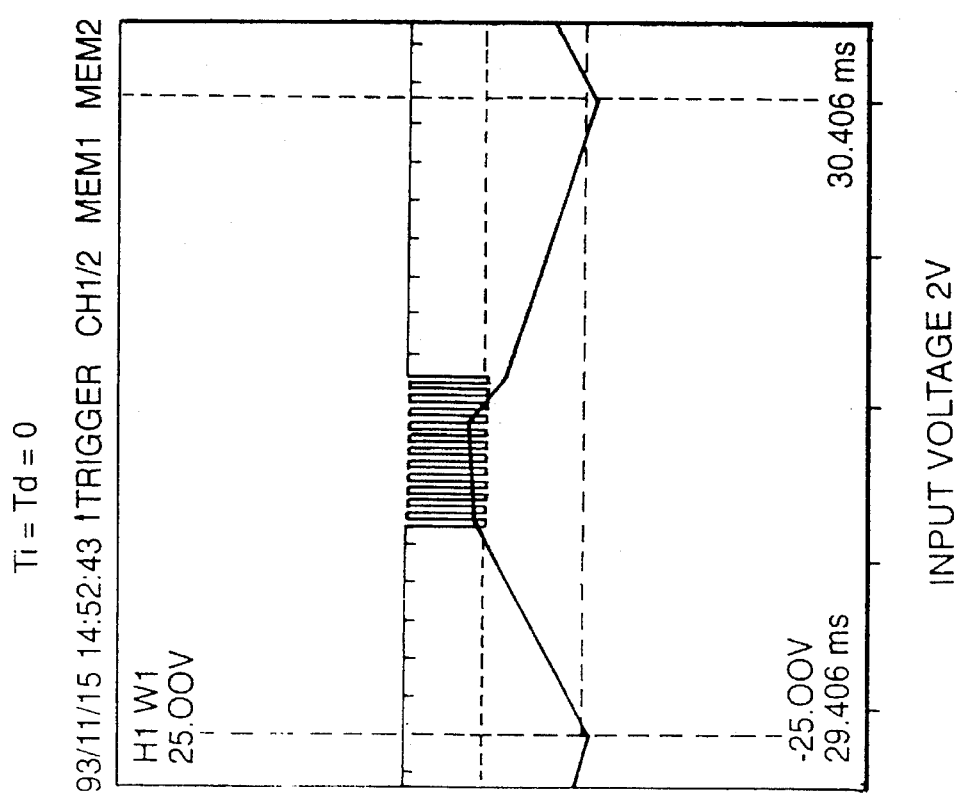
Figure 8D:
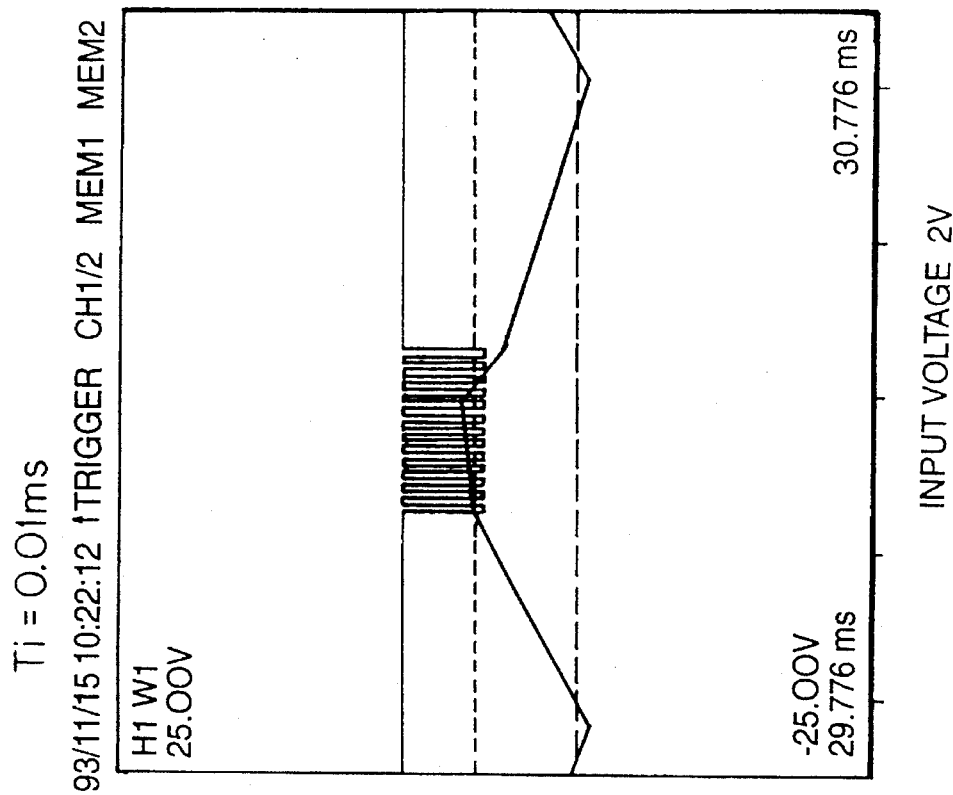
Figure 8C:
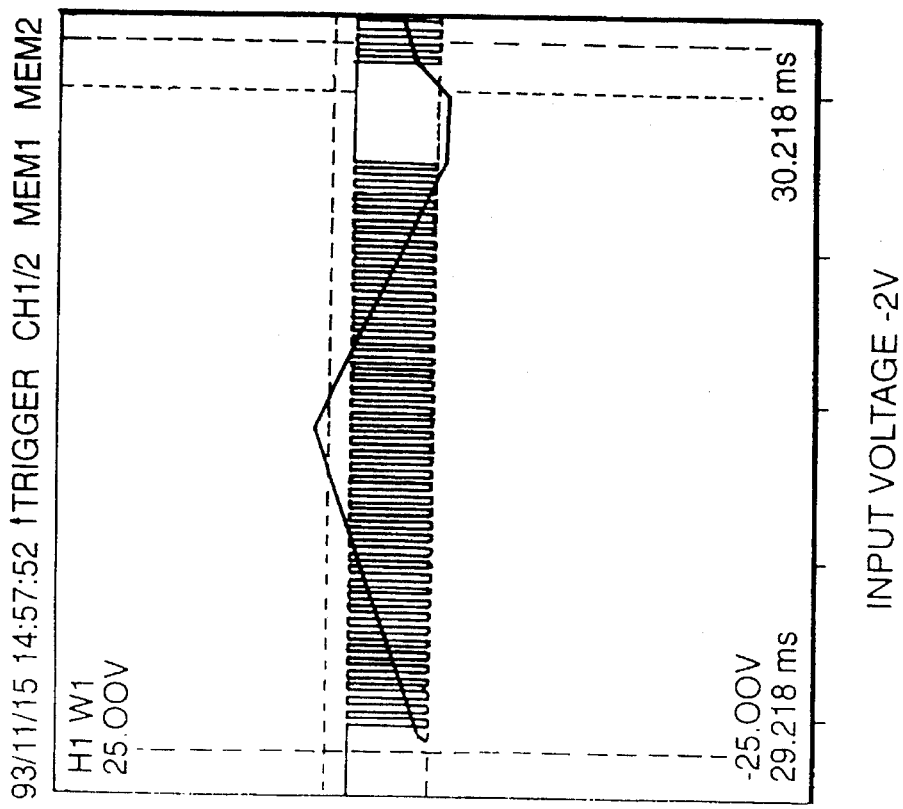
Figure 8F:
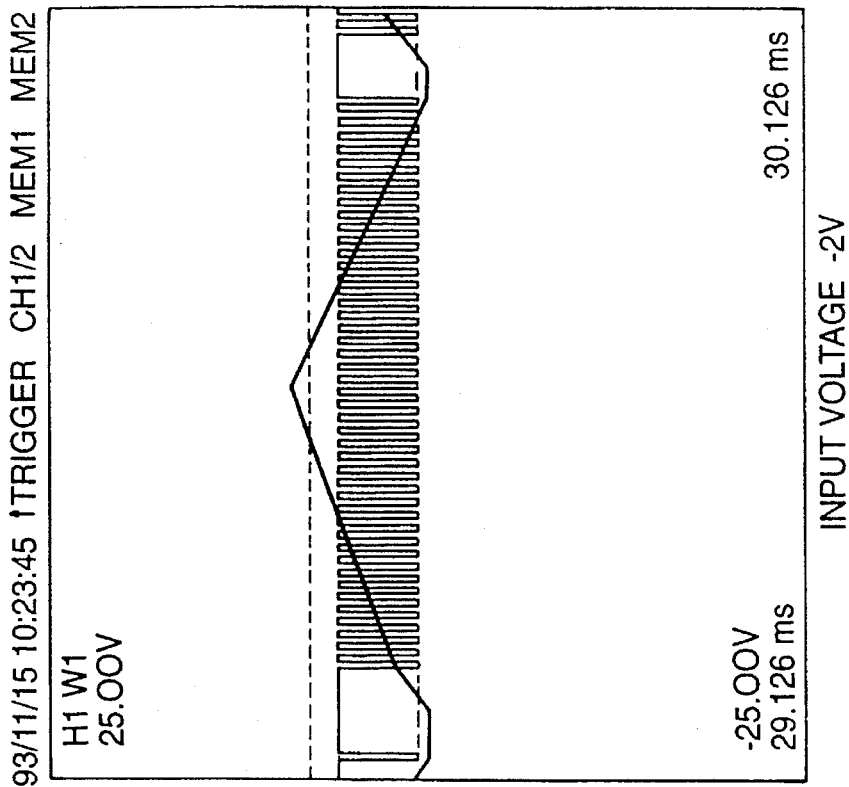
Figure 8E:
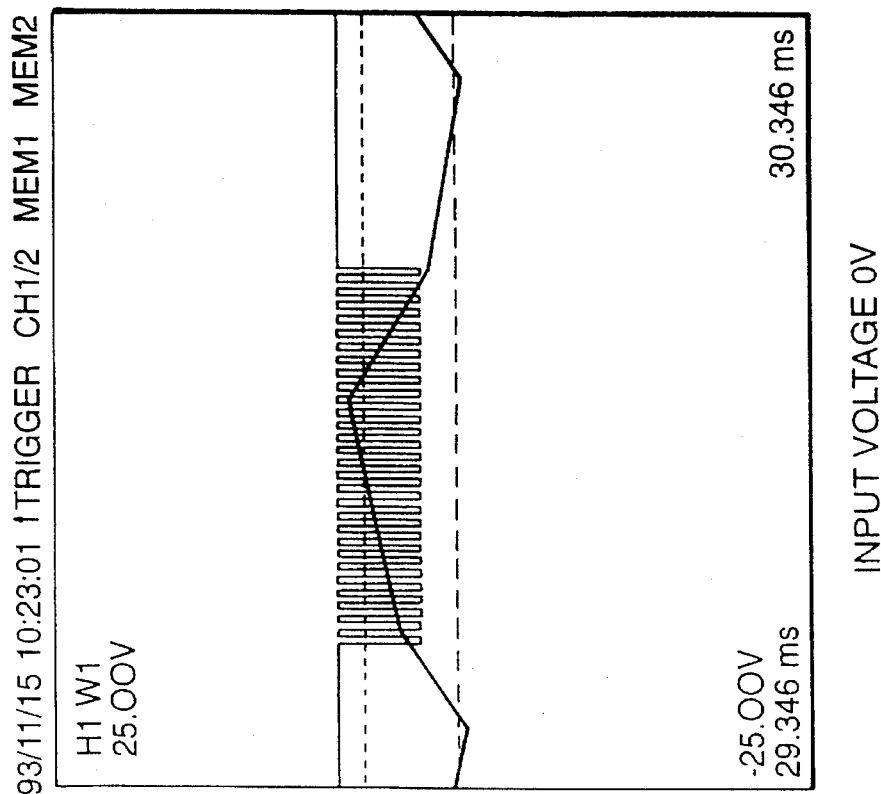
Figure 8H:
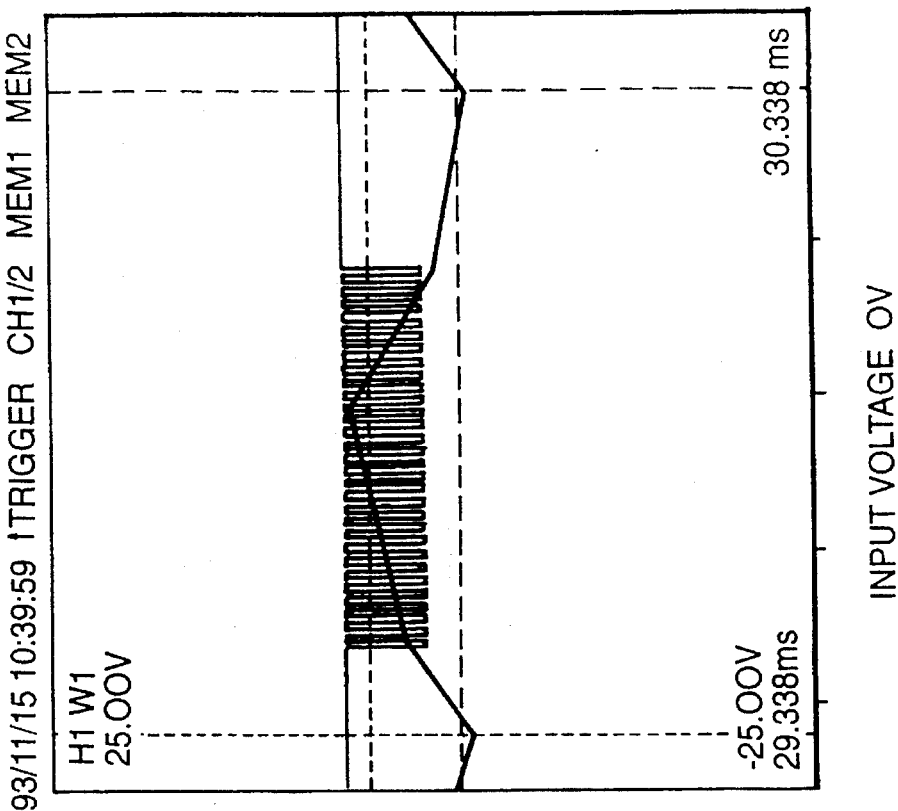
Figure 8G:
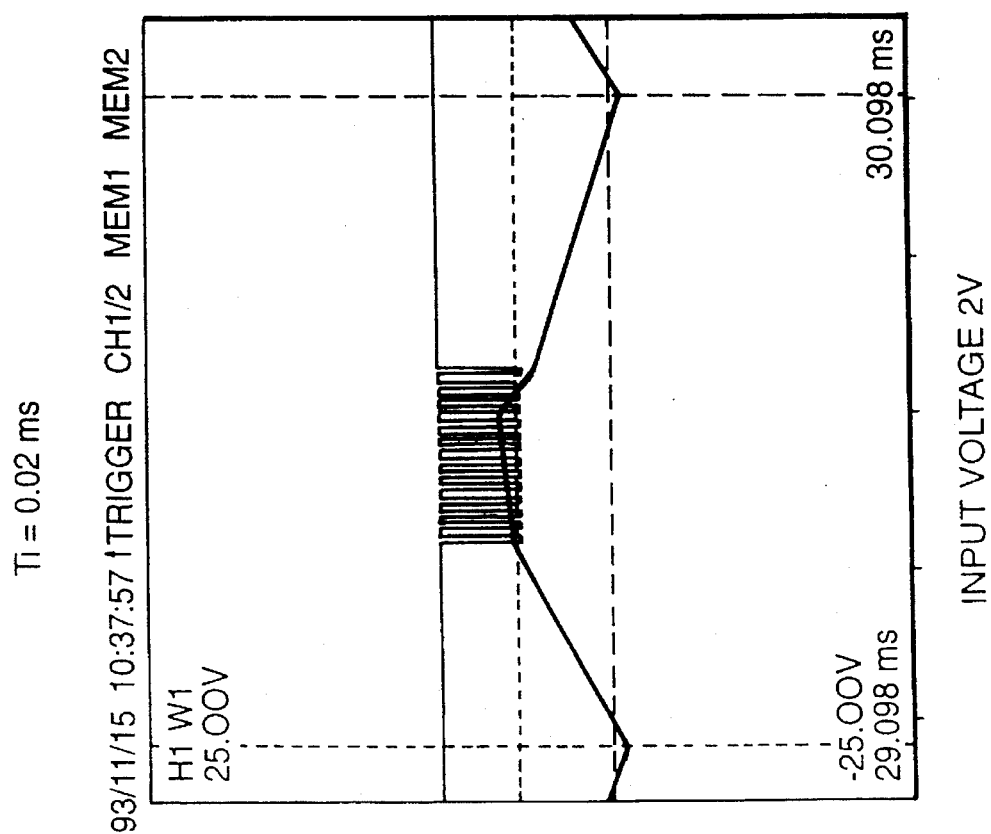
Figure 8J:
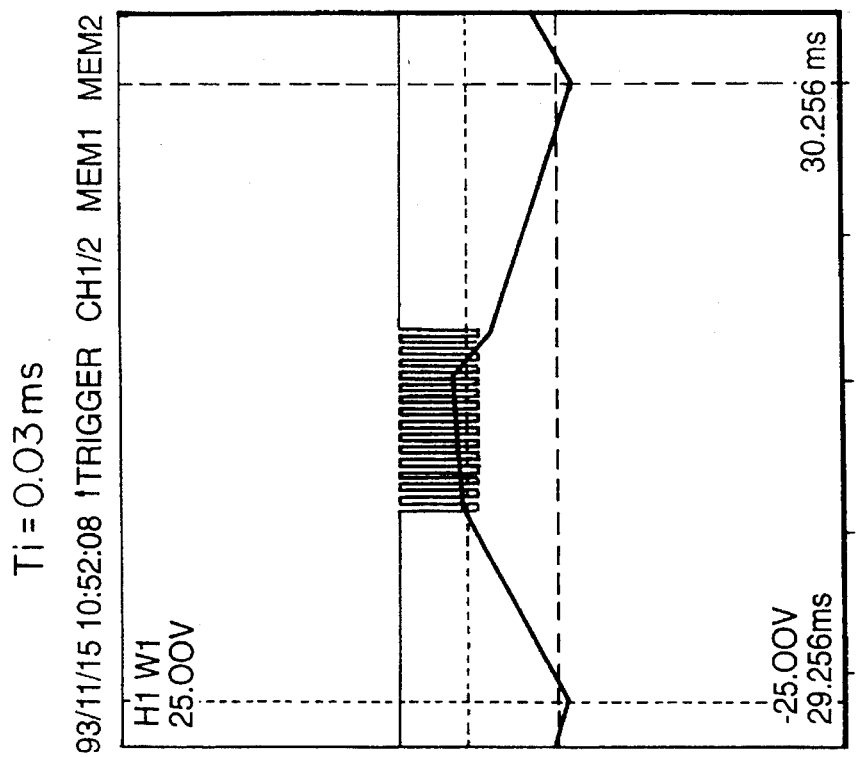
Figure 8I:
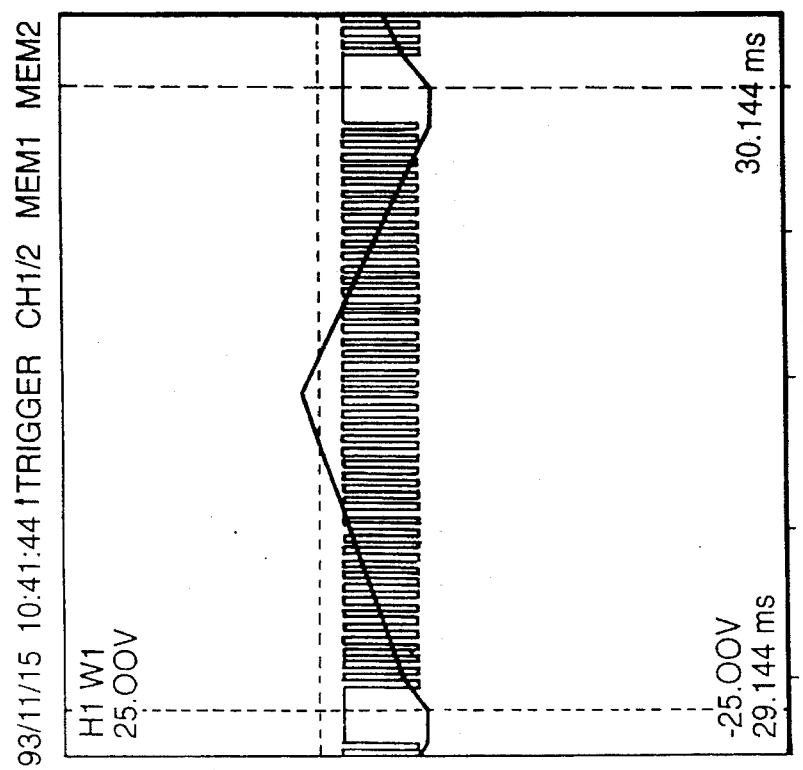
Figure 8L:
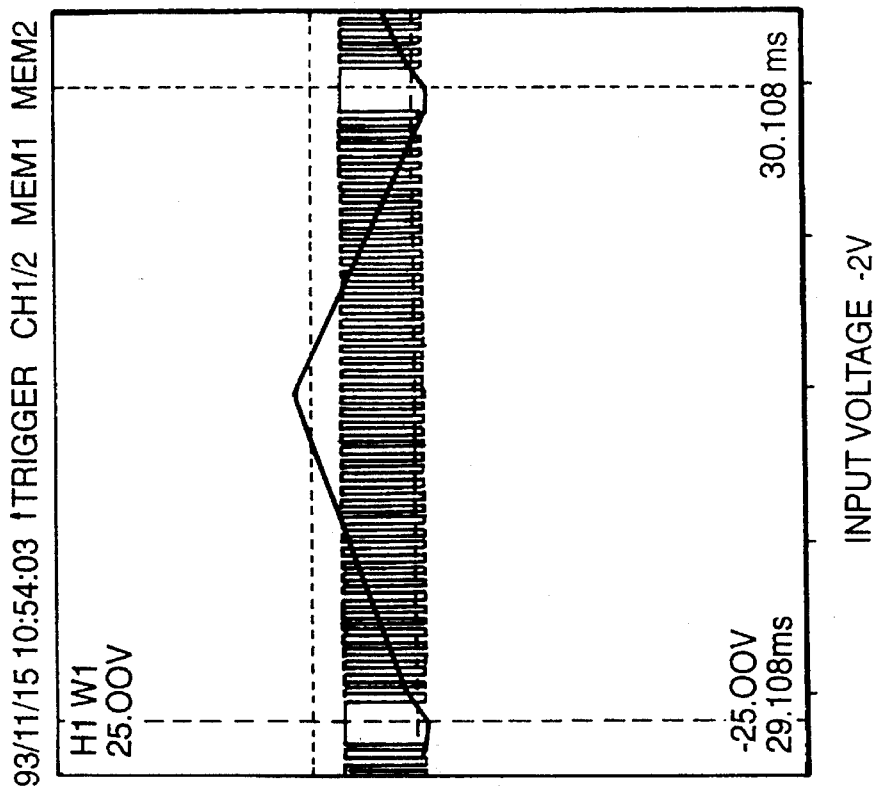
Figure 8K:
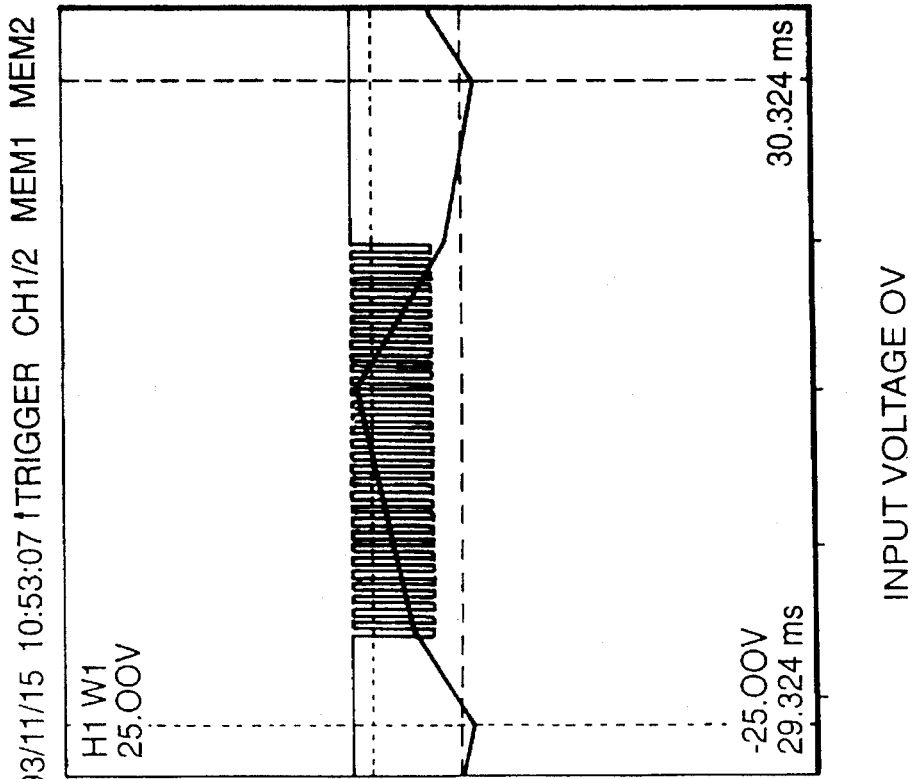
Figure 8N:
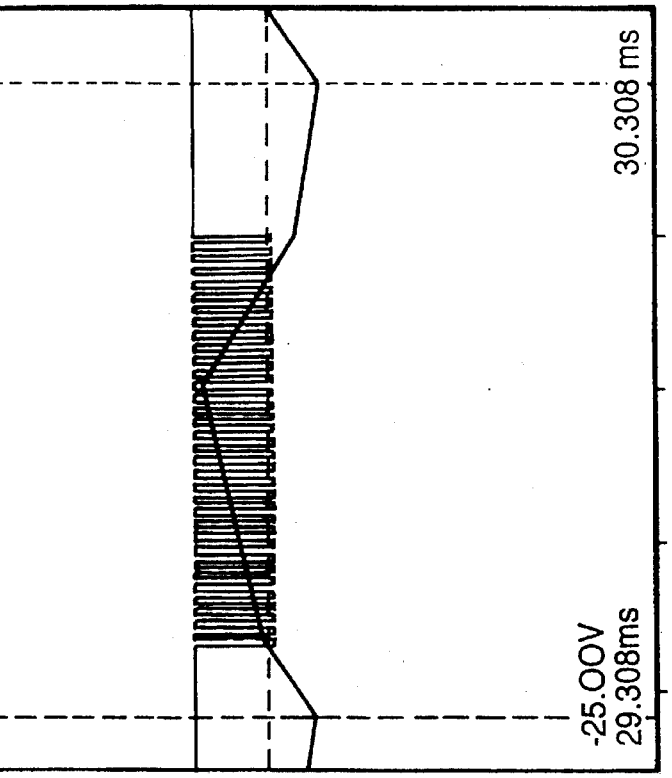
Figure 8M:
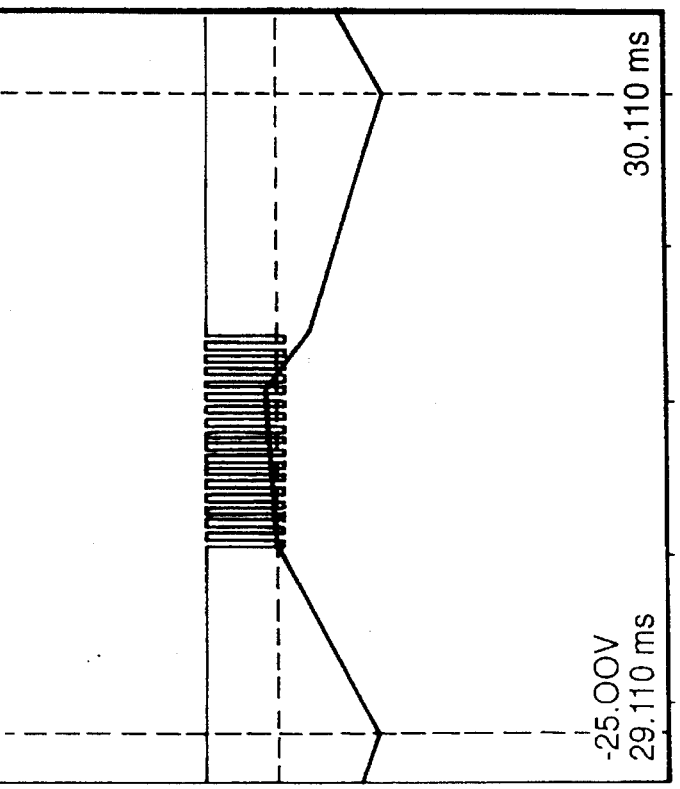

FIGS. 8A–8C illustrate a PWM output waveform when $T_i = T_d = 0$. The waveform shown in FIGS. 8A–8C is the same as the output waveform of a pulse width controller adopting a conventional feedback PWM integration system. FIGS. 8D to FIG. 8O illustrate increasing pulses counted according to an enlargement of pulse width $T_i$ of the variable pulse signal synchronized with a rising edge of the carrier signal.

Figure 9A:
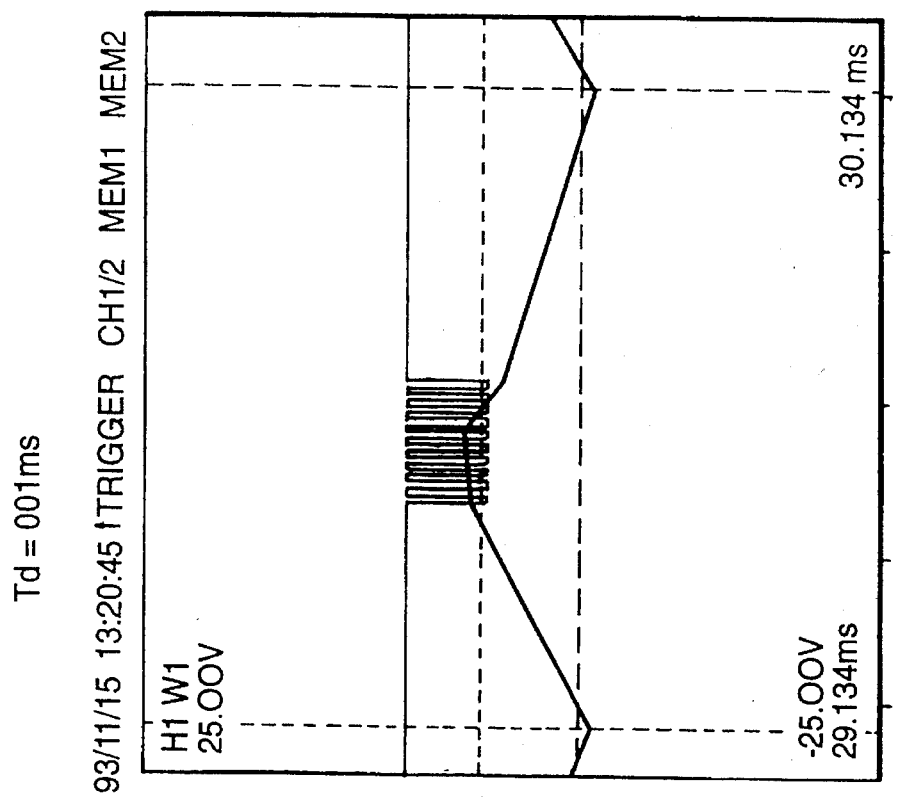
FIGS. 9A to 9U illustrate the waveform of a PWM signal output from an actual circuit according to pulse width $T_d$ of the positive carrier-synchronous variable pulse signal.
Figure 80:
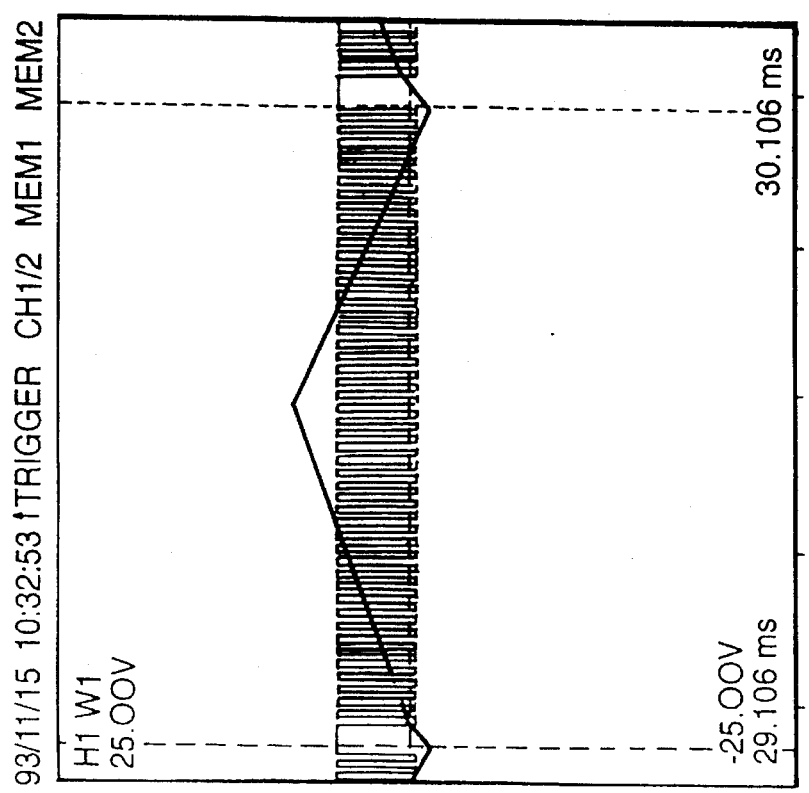
Figure 9C:
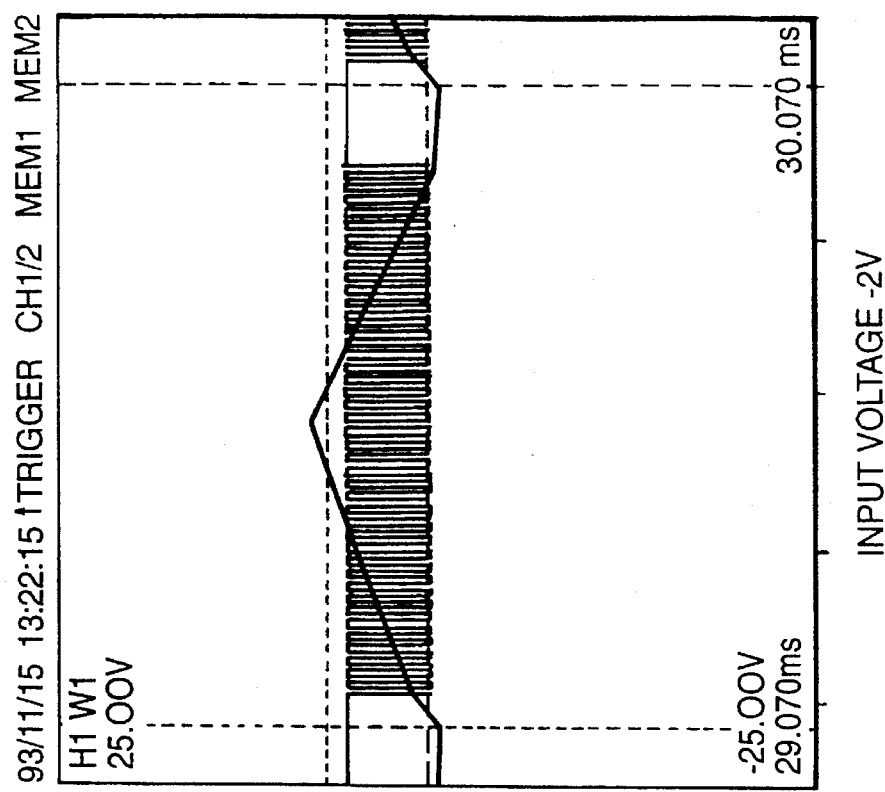
Figure 9B:
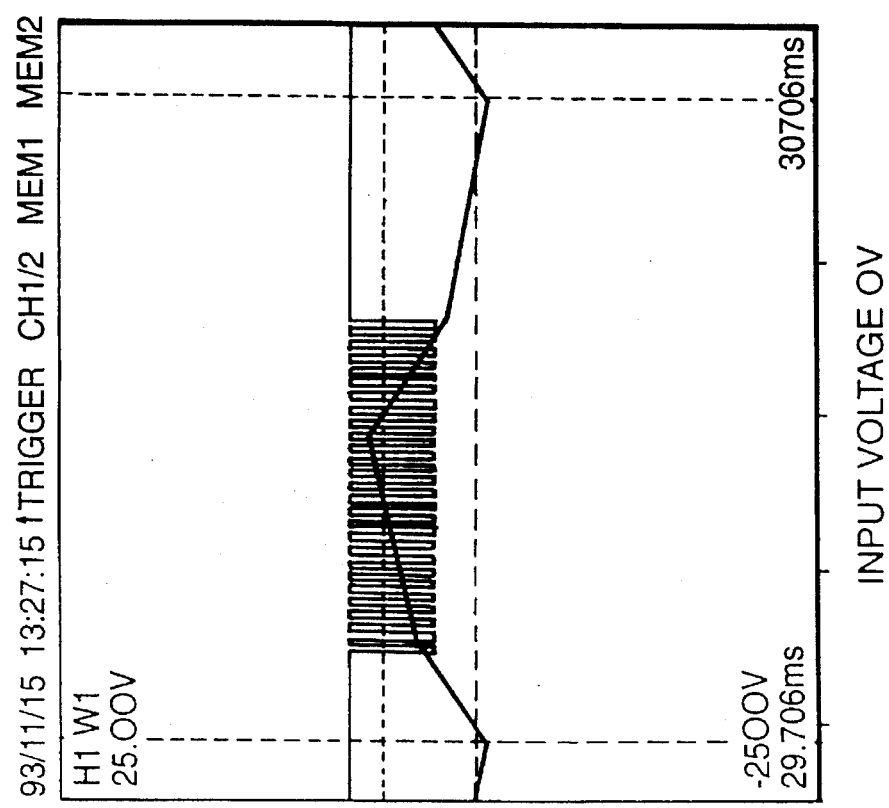
Figure 9E:
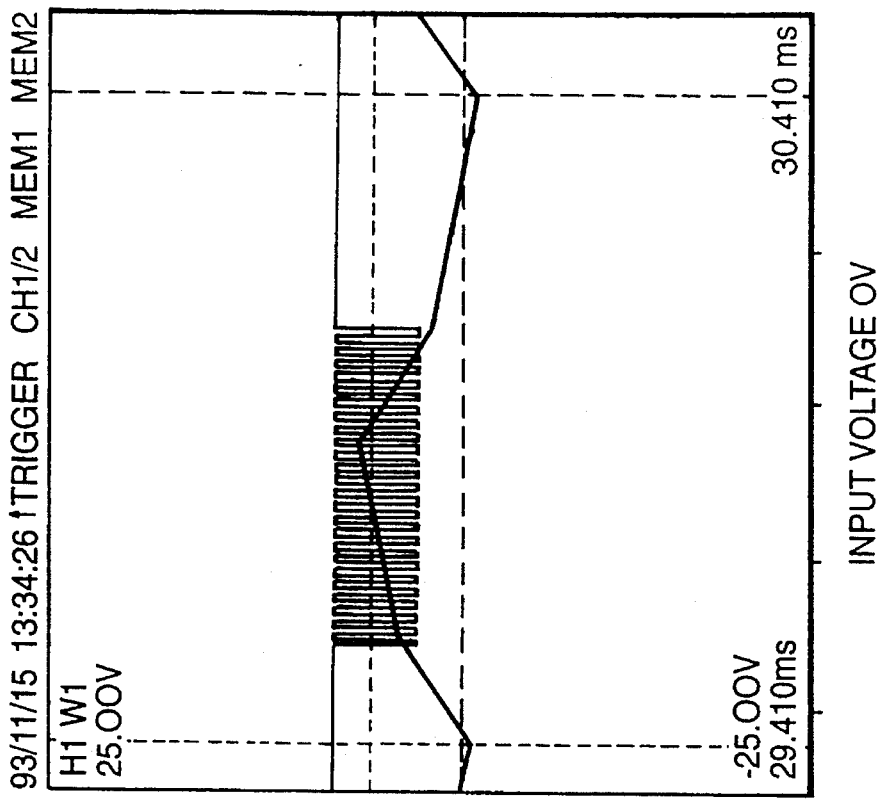
Figure 9D:
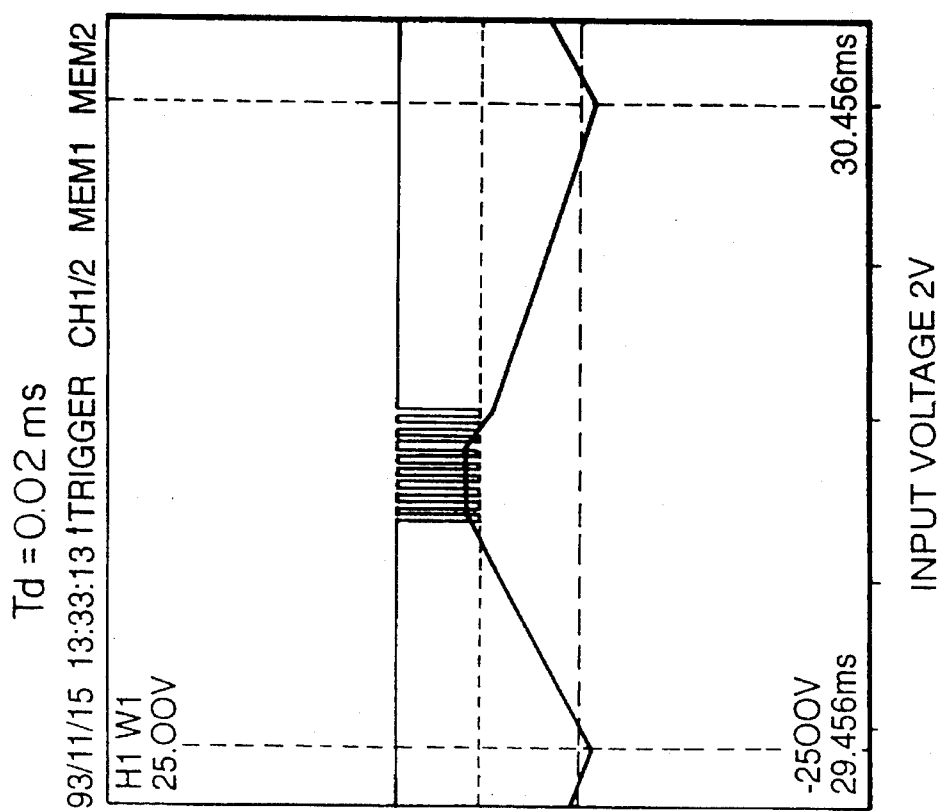
Figure 9G:
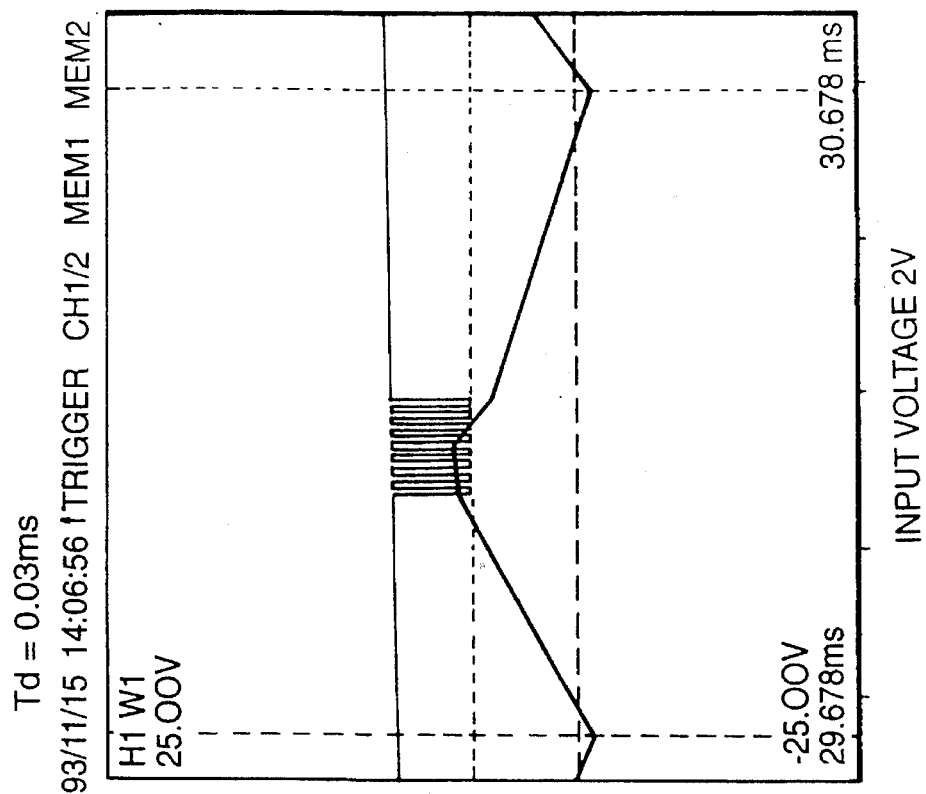
Figure 9F:
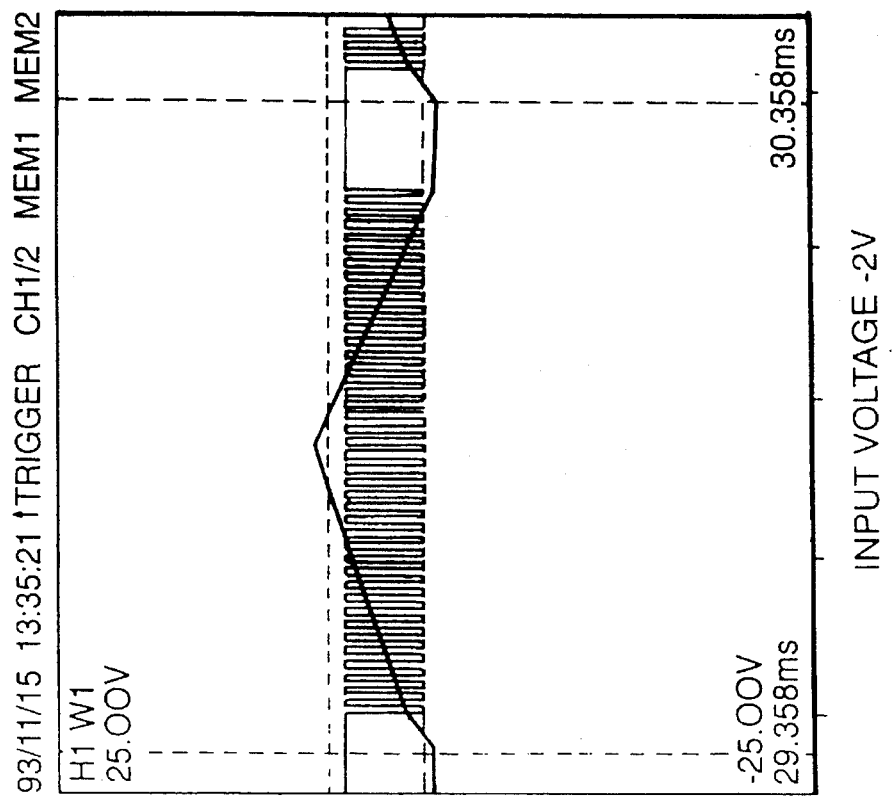
Figure 9I:
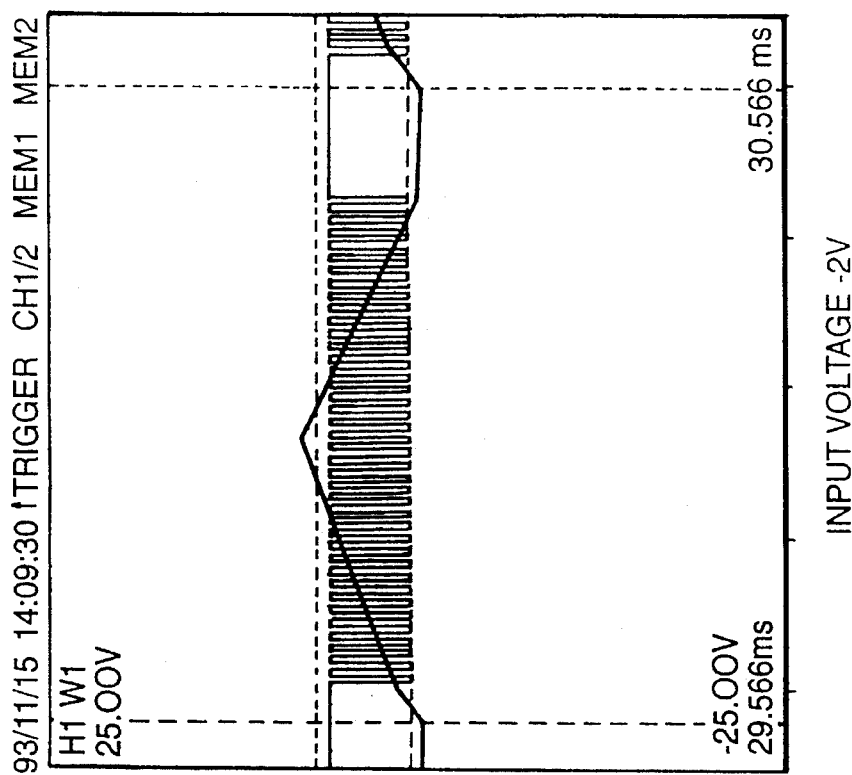
Figure 9H:
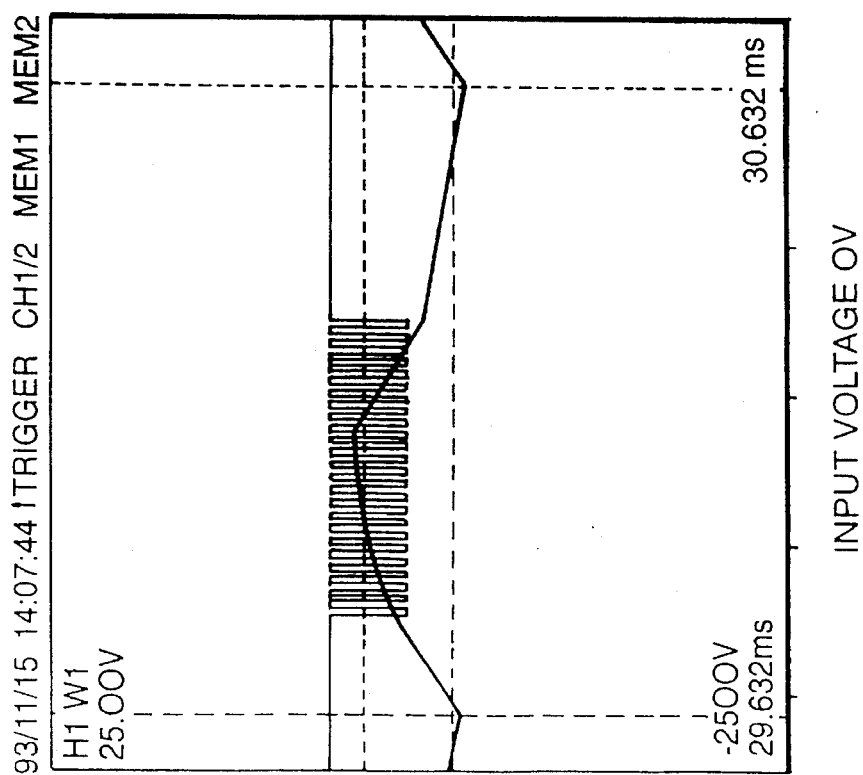
Figure 9K:
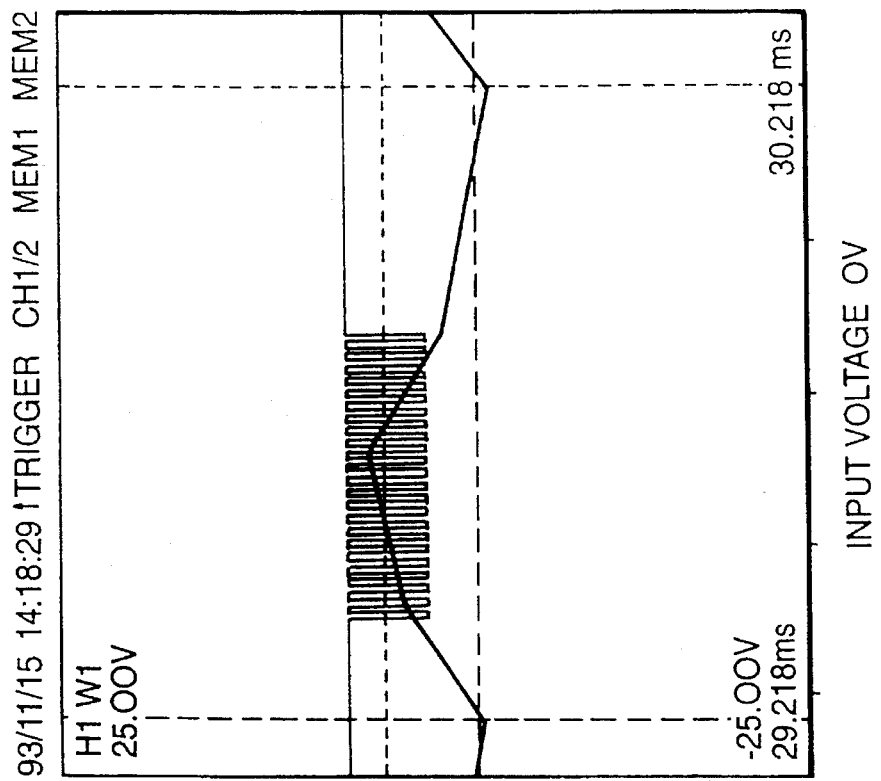
Figure 9J:
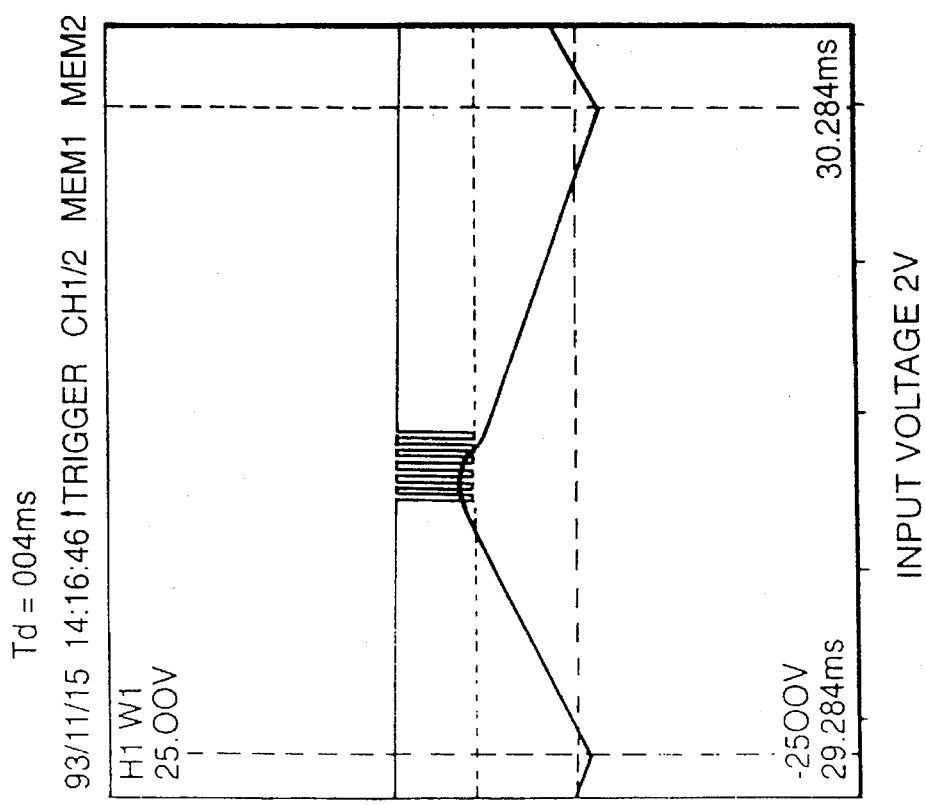
Figure 9M:
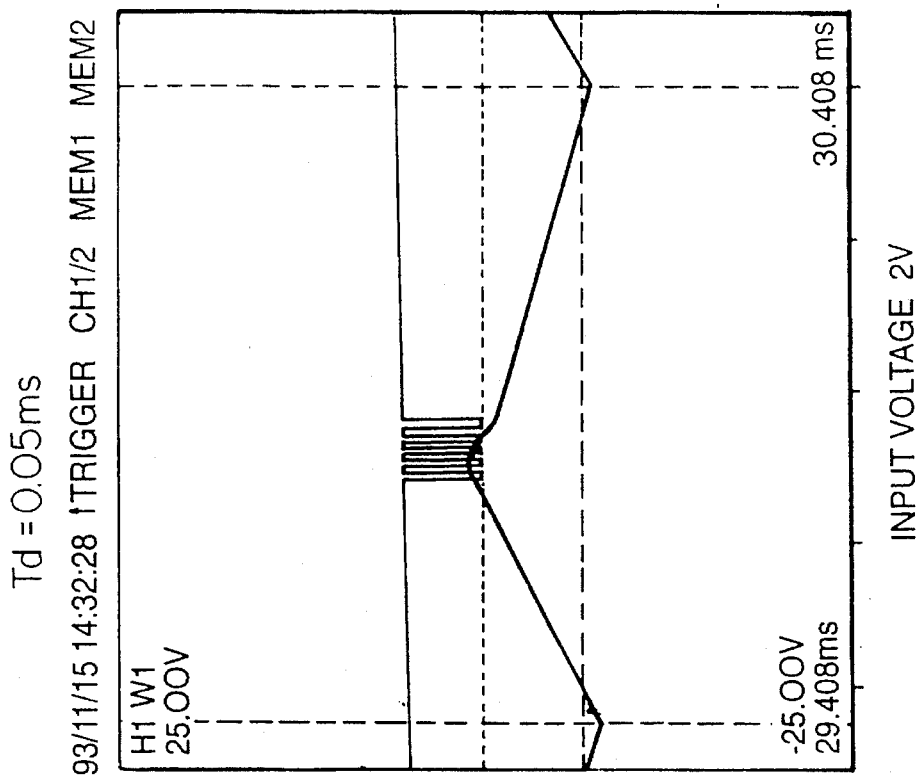
Figure 9L:
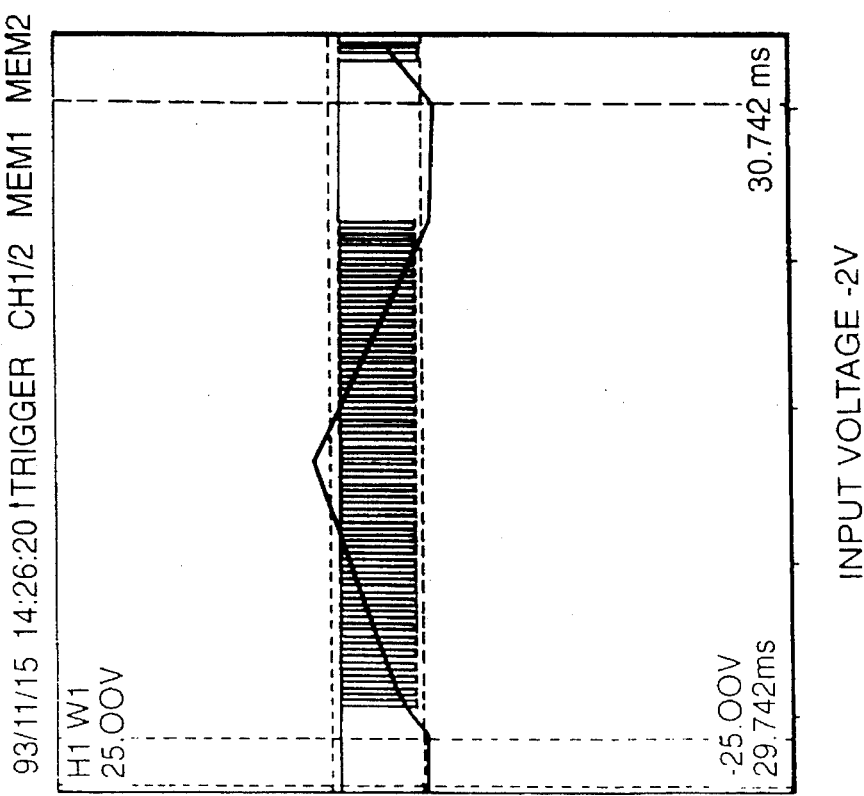
Figure 9O:
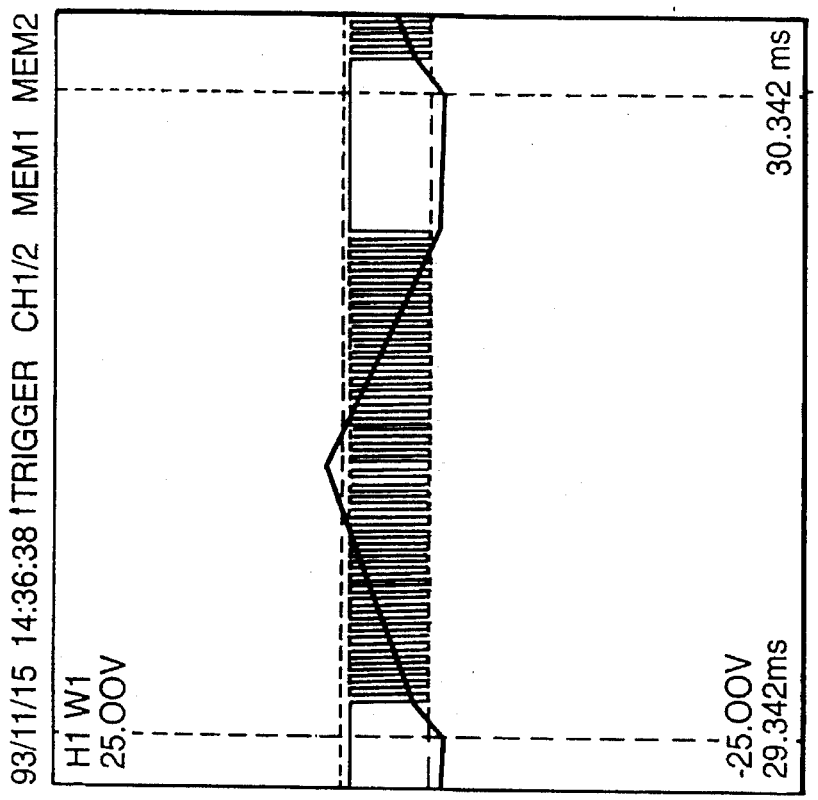
Figure 9N:
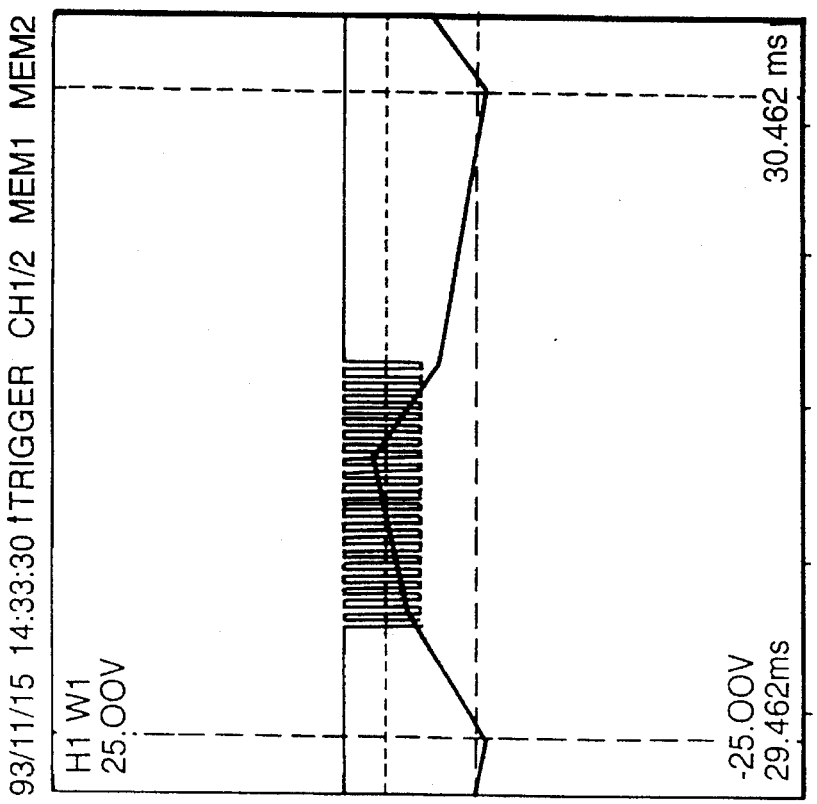
Figure 9Q:
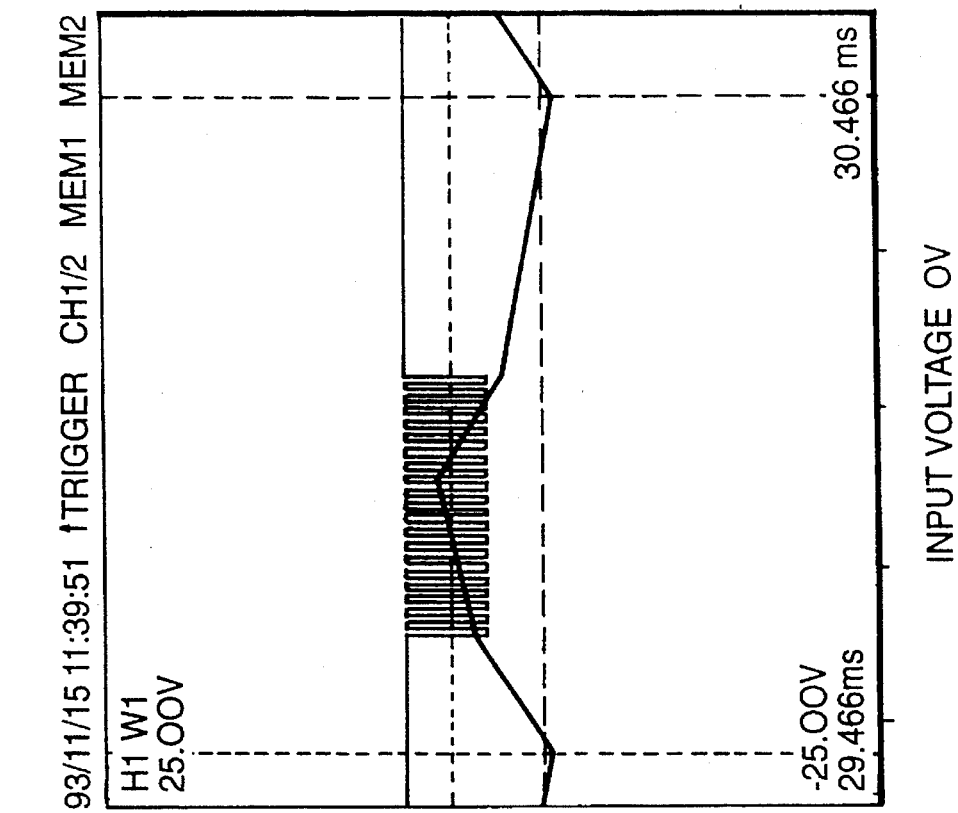
Figure 9P:
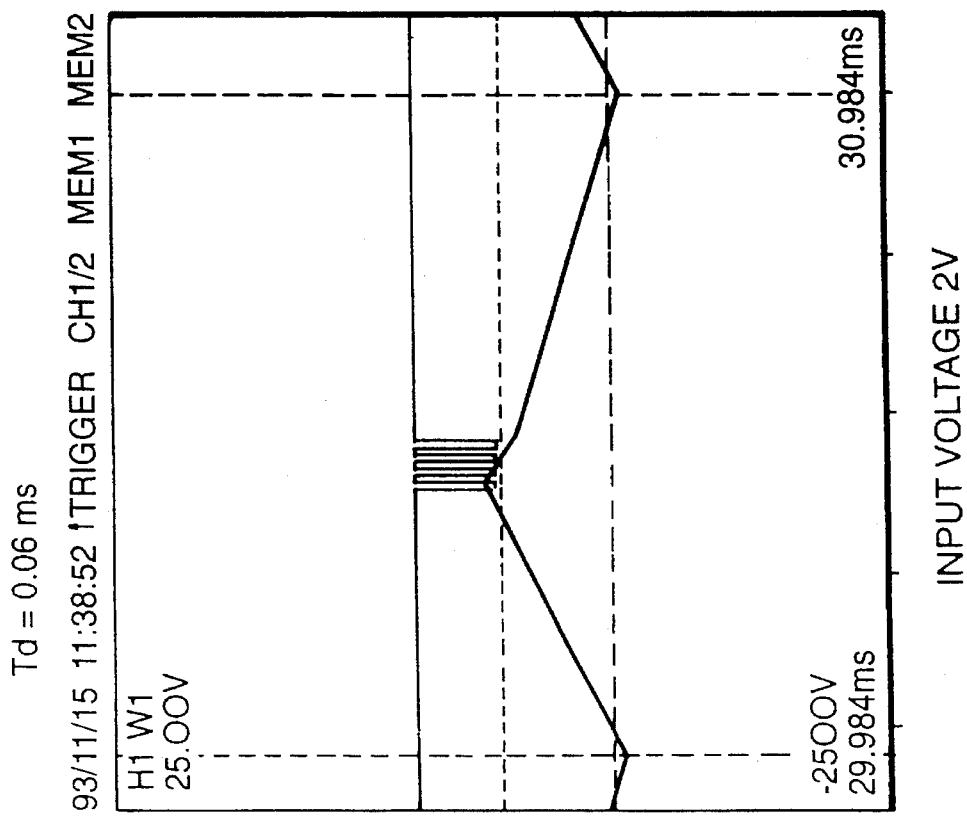
Figure 9S:
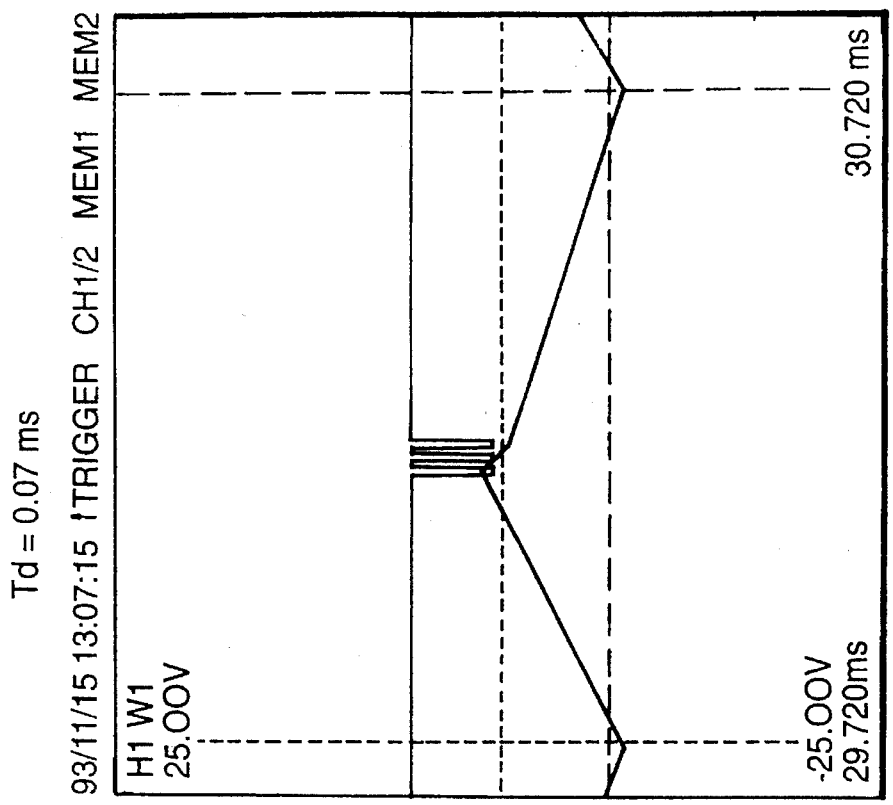
Figure 9R:
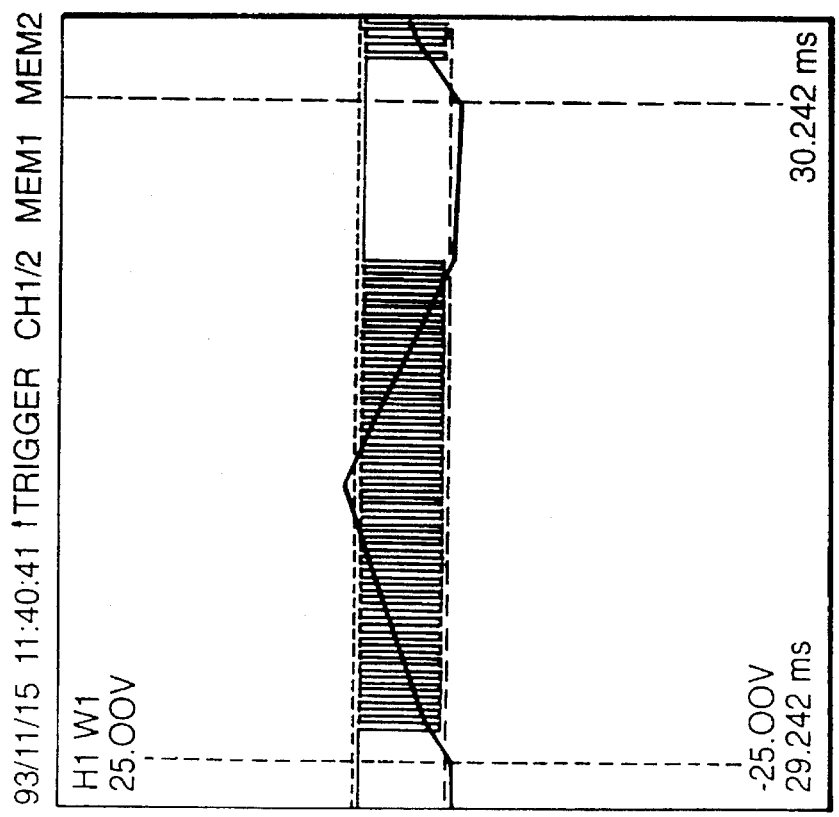
Figure 9U:
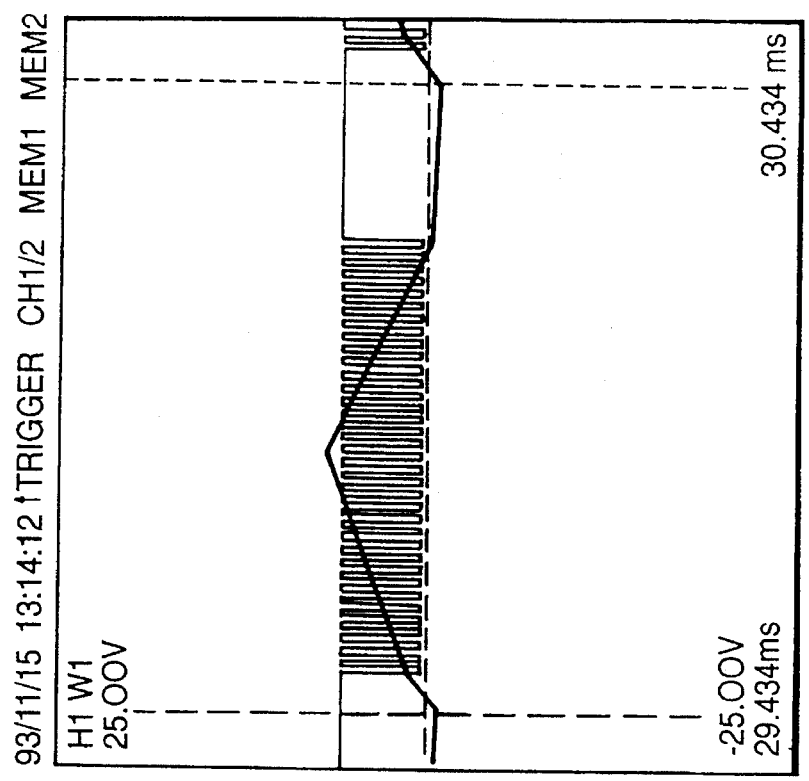
Figure 9T:
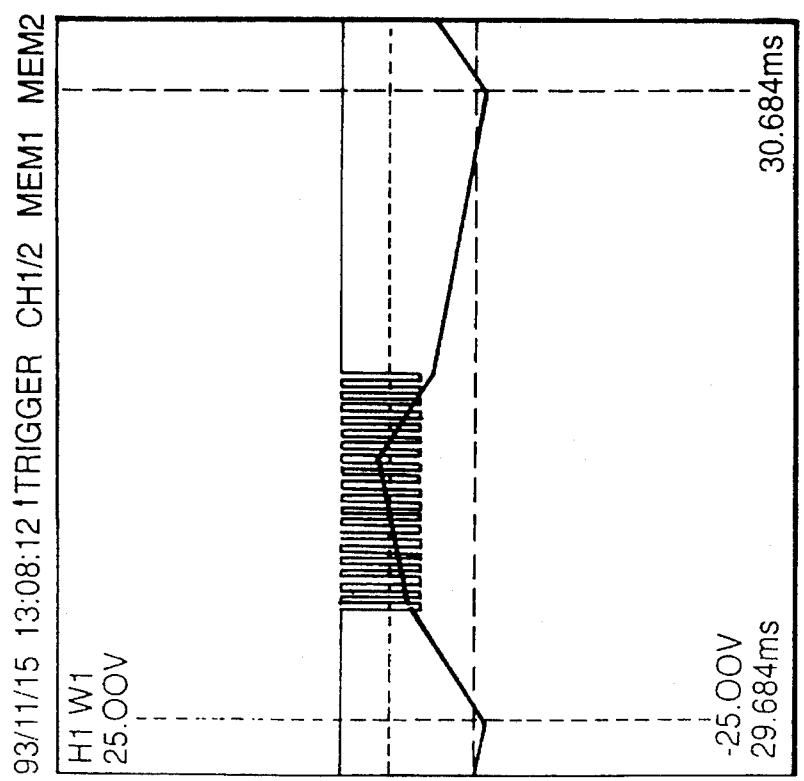

FIGS. 9A to 9U illustrate decreasing pulses counted according to an enlargement of pulse width $T_d$ of the variable pulse signal synchronized with a falling edge of the carrier signal. The curve point (corresponding to points "a" and "b" of FIG. 10) of the integrated waveform and reference voltage line do not accord in FIGS. 8A to 8F and FIGS. 9A to 9U due to the hysteresis of the comparator.

Figure 10:
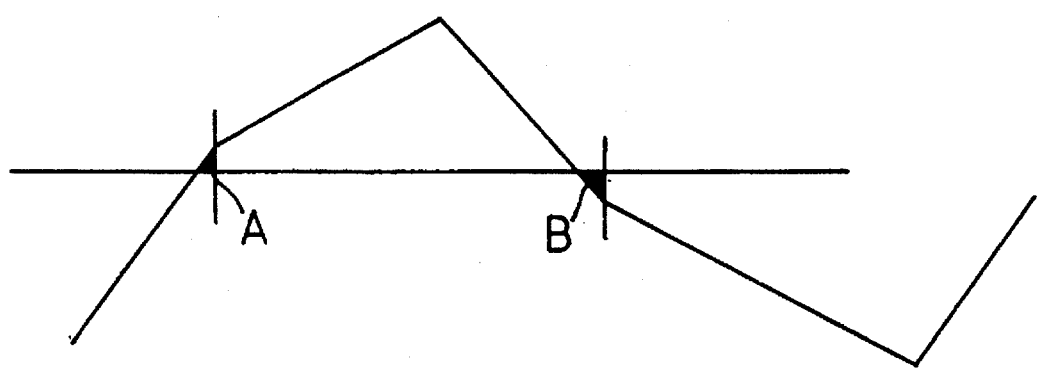
FIG. 10 is a graph illustrating that a PWM output waveform error caused by comparator hysteresis can be ignored.

As shown in FIG. 10, a PWM output waveform variance caused by the comparator hysteresis can be ignored since the filled-in areas on opposite sides of the reference voltage cancel each other. Therefore, a pulse width corresponding to the amplitude of an analog input signal has no variance.

As described above, a pulse width controller adopting a conventional feedback PWM integration system changes pulse width by input voltage ($E_x$). Moreover, a minute change in the output by input voltage ($E_x$) is possible by reference voltage ($E_s$). However, a pulse width controller of the present invention adopting a feedback PWM integration system employing a carrier-synchronous signal, proposes sixteen kinds for varying pulse width without varying the input voltage or a varying reference voltage. One of these methods, a method for enlarging pulse width in response to a negative pulse voltage synchronized with the carrier's rising edge and simultaneously reducing the pulse width in response to a positive pulse voltage synchronized with the carrier's falling edges, can be applied to A/D conversion processes in the software field and to an extension input voltage of A/D converter in the hardware field. Therefore, the method can be extensively applied in a scope of a precise control instrument using an A/D converter. In other words, a change in the feedback pulse width modulation is expressed by setting the input voltage as a fixed value and varying a variable pulse width in response to output with carrier synchronization. In addition, the number of clock pulses passing through a gate is controlled by pulse width to thereby select and count the pulses with respect to an input voltage level. Thus, the scope of application of a feedback PWM integration system can be extended, and a variable pulse can be used as a sensor signal, to thereby be applied to various control instruments.

What is claimed is:

1. A pulse width controller, comprising:
   means for generating a carrier signal;
   carrier synchronization means for generating a carrier synchronous variable pulse signal that varies in accordance with the voltage level of said carrier signal;
   an integrator for integrating a reference signal, said carrier signal and said carrier synchronous variable pulse signal to generate an integrated input signal;
   a comparator for comparing said integrated input signal with a comparison signal to generate a compared input signal; and
   means for synchronizing said compared input signal with one or more of said carrier signal and carrier synchronous variable pulse signal to generate a synchronous input signal and providing said synchronous input signal to the input of said integrator to be integrated with other signals.

2. The pulse width controller of claim 1, further comprising a switch for selecting a positive or negative polarity of said reference signal based on the voltage level of said compared input signal.

3. The pulse width controller of claim 1, wherein said carrier synchronization means includes means for varying the pulse width of said carrier synchronous variable pulse signal in accordance with the voltage level of said carrier signal.

4. The pulse width controller of claim 1, wherein said carrier synchronization means includes means for eliminating the DC component of the carrier signal and the carrier synchronous variable pulse signal.

5. The pulse width controller of claim 1, wherein the voltage level of said carrier signal is twice as large as that of said reference signal.

6. The pulse width controller of claim 1, wherein said synchronizing means includes a flip-flop.

7. The pulse width controller the claim 1, further comprising:
   an AND gate, coupled to the output of said synchronizing means and a clock pulse generator, for producing a pulse width modulation output signal; and
   a counter for counting the pulses of said pulse width modulation output signal.

8. The pulse width controller of claim 1, wherein said carrier synchronization means includes means for generating said carrier synchronous variable pulse signal having an integrated composite waveform whose pulse width components $T_1$ and $T_2$ can be expressed with a movement coefficient α as $$T_1 = \frac{T[1 - (E_x/E_s)]}{2} + \alpha T_i$$

$$T_2 = \frac{T[1 + (E_x/E_s)]}{2} - \alpha T_i$$

$$E_s(T_2 - T_1) = TE_x - 2T_i E_c$$

wherein T is the period of the integrated composite signal, $T_1$ indicates the time during which the voltage of the integrated waveform is above that of the reference voltage, $T_2$ indicates the time during which the voltage of the integrated waveform is below the reference voltage, $T_i$ is the pulse width of a negative carrier synchronous variable pulse signal, $E_x$ is the reference signal, and the movement coefficient α is equal to a carrier voltage $E_c$ divided by a reference voltage $E_s$.

9. The pulse width controller of claim 1, wherein said carrier synchronization means includes means for generating said carrier synchronous variable pulse signal having an integrated composite waveform whose pulse width components $T_1$ and $T_2$ can be expressed with a movement coefficient β, as $$T_1 = \frac{T[1 - (E_x/E_s)]}{2} - \beta T_d$$

$$T_2 = \frac{T[1 + (E_x/E_s)]}{2} + \beta T_d$$

$$E_s(T_2 - T_1) = TE_x - 2T_i E_c$$

wherein T is the period of the integrated composite signal $T_d$ indicates the time during which the voltage of the integrated waveform is above that of the reference voltage, $T_2$ indicates the time during which the voltage of the integrated waveform is below the reference voltage, $T_d$ is the pulse width of a positive carrier synchronous variable pulse signal, $E_x$ is the reference signal, and the movement coefficient $\beta$ is equal to a carrier voltage $E_c$ divided by a reference voltage $E_s$.

10. The pulse width controller of claim 2, wherein said switch includes means for selecting a negative reference signal if said compared input signal has a "high" signal level and a positive reference signal if said compared input signal has a "low" signal level.

11. The pulse width controller of claim 3, wherein said varying means of the carrier synchronization means includes at least two resistors and a variable pulse controller for controlling the pulse width of said carrier synchronous variable pulse signal.

12. The pulse width controller of claim 6, wherein said flip-flop includes a D flip-flop.

13. The pulse width controller of claim 11, wherein one of said resistors corresponds to said reference signal having a negative polarity and at least one other resistor corresponds to said reference signal having a positive polarity.

14. The pulse width controller of claim 13, wherein said variable pulse controller comprises a first monostable multivibrator corresponding to said negative reference signal and a second monostable multivibrator corresponding to said positive reference signal.

* * * * *

UNITED STATES PATENT AND TRADEMARK OFFICE
CERTIFICATE OF CORRECTION

PATENT NO. : 5,519,361
DATED : May 21, 1996
INVENTOR(S) : Jin-bok KIM

It is certified that error appears in the above-indentified patent and that said Letters Patent is hereby corrected as shown below:

Claim 9, Column 18, Line 64, "$-2T_iE_c$" should read -- $-2T_dE_c$ --;

Claim 9, Column 18, Line 65 "$T_d$" should read -- $T_1$ --.

Signed and Sealed this

Nineteenth Day of November, 1996

*Attest:*

BRUCE LEHMAN

*Attesting Officer*     *Commissioner of Patents and Trademarks*